United States Patent
Nigo

(10) Patent No.: US 11,916,501 B2
(45) Date of Patent: Feb. 27, 2024

(54) DRIVING DEVICE, COMPRESSOR, AND AIR CONDITIONER

(71) Applicant: Mitsubishi Electric Corporation, Tokyo (JP)

(72) Inventor: Masahiro Nigo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 383 days.

(21) Appl. No.: 17/272,755

(22) PCT Filed: Nov. 21, 2018

(86) PCT No.: PCT/JP2018/042930
§ 371 (c)(1),
(2) Date: Mar. 2, 2021

(87) PCT Pub. No.: WO2020/105131
PCT Pub. Date: May 28, 2020

(65) Prior Publication Data
US 2021/0211085 A1  Jul. 8, 2021

(51) Int. Cl.
*H02P 27/08* (2006.01)
*H02P 29/60* (2016.01)
(Continued)

(52) U.S. Cl.
CPC ............ *H02P 27/08* (2013.01); *F25B 31/026* (2013.01); *G01R 19/16571* (2013.01);
(Continued)

(58) Field of Classification Search
CPC ........ H02P 27/08; H02P 29/60; H02P 25/184; H02P 29/027; F25B 31/026; G01R 19/16571; G01R 19/32; H01F 1/053; H02K 1/02; H02K 1/276
See application file for complete search history.

(56) References Cited

U.S. PATENT DOCUMENTS 8,777,585 B2 * 7/2014 Nakano .................. F04B 49/065
310/94
2009/0237020 A1 * 9/2009 Sakai ...................... H02P 27/08
318/400.11
(Continued)

FOREIGN PATENT DOCUMENTS

CN  103516292 A  1/2014
JP  H7-337072 A  12/1995
(Continued)

OTHER PUBLICATIONS

International Search Report of the International Searching Authority dated Feb. 12, 2019 for the corresponding International application No. PCT/JP2018/042930 (and English translation).
(Continued)

*Primary Examiner* — Zoheb S Imtiaz
(74) *Attorney, Agent, or Firm* — POSZ LAW GROUP, PLC

(57) ABSTRACT

A driving device drives a motor including a rotor having a neodymium rare earth magnet. The driving device includes an inverter, a first detector that outputs a first detection signal corresponding to a motor driving current supplied to the motor, a protection level setting unit that sets an overcurrent protection level, a second detector that outputs a second detection signal corresponding to a driving state of the motor, and a control device. The control device executes first control of lowering the motor driving current immediately after the motor driving current corresponding to the first detection signal exceeds the overcurrent protection level. When the protection level setting unit lowers the overcurrent protection level to a new current level based on the second detection signal, the control device executes second control of lowering the motor driving current to a level lower than the new current level.

15 Claims, 16 Drawing Sheets

(51) Int. Cl.
  *F25B 31/02*    (2006.01)
  *G01R 19/165*   (2006.01)
  *G01R 19/32*    (2006.01)
  *H01F 1/053*    (2006.01)
  *H02K 1/02*     (2006.01)
  *H02K 1/276*    (2022.01)
  *H02P 25/18*    (2006.01)
  *H02P 29/024*   (2016.01)

(52) U.S. Cl.
  CPC ............ *G01R 19/32* (2013.01); *H01F 1/053* (2013.01); *H02K 1/02* (2013.01); *H02K 1/276* (2013.01); *H02P 25/184* (2013.01); *H02P 29/027* (2013.01); *H02P 29/60* (2016.02)

(56) References Cited

U.S. PATENT DOCUMENTS

2013/0342137 A1   12/2013   Yamaguchi
2015/0008849 A1*  1/2015    Benson .................. B60L 58/22
                                                        318/400.21

FOREIGN PATENT DOCUMENTS

| JP | H11-103589 A  | 4/1999  |
| JP | 2007-6613 A   | 1/2007  |
| JP | 2012-55119 A  | 3/2012  |
| JP | 2012-196142 A | 10/2012 |
| JP | 2013-255373 A | 12/2013 |
| JP | 2014-007905 A | 1/2014  |
| JP | 2014-18070 A  | 1/2014  |

OTHER PUBLICATIONS

Office Action dated Nov. 9, 2021 in connection with counterpart Japanese Patent Application No. 2020-557075 as well as a machine Engllish translation.

Japanese Office Action dated May 10, 2022 in connection with counterpart Japanese Patent Application JP2020-557075 (and English machine translation).

Chinese Office Action dated Sep. 28, 2023 in connection with counterpart Chinese Patent Application 201880098689.2 (and English machine translation).

* cited by examiner

Y CONNECTION

Δ CONNECTION

DRIVING DEVICE, COMPRESSOR, AND AIR CONDITIONER

CROSS REFERENCE TO RELATED APPLICATION

This application is a U.S. national stage application of International Application No. PCT/JP2018/042930 filed on Nov. 21, 2018, the contents of which are incorporated herein by reference.

TECHNICAL FIELD

The present invention relates to a driving device that drives a motor, a compressor including a motor and the driving device, and an air conditioner including the compressor.

BACKGROUND

Conventionally, a driving device that drives a rare earth magnet motor (referred to also as a "permanent magnet motor" or a "motor") including a rotor provided with a rare earth magnet includes an inverter that supplies a motor driving current to a stator winding (also referred to simply as a "coil") of the motor and a control device that performs PWM (Pulse Width Modulation) control on the inverter. There has also been proposed a driving device having a protective function of reducing (including interrupting) the motor driving current immediately after the motor driving current supplied to the motor exceeds a threshold value (i.e., a set value) (see Patent Reference 1, for example). The threshold value is a current level for protecting the motor from overcurrent, that is, an upper limit of the motor driving current for preventing the motor driving current from causing irreversible demagnetization to the rare earth magnet, and is referred to also as an "overcurrent protection level". In a case where the reduction in the motor driving current is the interruption of the motor driving current, the "overcurrent protection level" is referred to also as an "overcurrent interruption level".

Incidentally, the rare earth magnet has a property of becoming likely to be demagnetized as its temperature rises. Namely, with the increase in the temperature, the rare earth magnet of the rotor is demagnetized by a lower motor driving current. Therefore, in the driving device for a rare earth magnet motor, the overcurrent protection level is set so that the irreversible demagnetization does not occur at the highest temperature in a temperature range in which the motor is usable (i.e., operating temperature range), and the motor driving current is reduced (generally, interrupted) immediately after the motor driving current exceeds the overcurrent protection level.

PATENT REFERENCE

Patent Reference 1: Japanese Patent Application Publication No. 7-337072 (claim 1 and paragraph 0010, for example)

However, the overcurrent protection level that has been set so that the irreversible demagnetization does not occur at the highest temperature in the operating temperature range is an excessively low current level in a low temperature range in the operating temperature range. Thus, even when the temperature of the motor is sufficiently low, the driving device cannot supply a high motor driving current to the motor, and the performance (output torque) of the motor cannot be fully utilized. Especially, a motor installed in a hermetic type compressor whose operating temperature range is wide cannot fully demonstrate its performance at low temperatures.

Further, in a case where the driving device is provided with a function of switching the overcurrent protection level depending on the temperature of the motor, it is expected that there will be frequent occurrence of a situation in which the motor driving current exceeds the overcurrent protection level and the motor stops at the moment when the overcurrent protection level is switched to a lower value. Therefore, reliability of the operation decreases in products including such a driving device.

SUMMARY

An object of the present invention, which has been made to resolve the above-described problems, is to provide a driving device that enables a motor to fully demonstrate its performance throughout the operating temperature range and makes it possible to secure high reliability of the operation of the motor, a compressor including the driving device, and an air conditioner including the compressor.

A driving device according to an aspect of the present invention is a device for driving a motor including a rotor having a neodymium rare earth permanent magnet, principal ingredients of which are neodymium, iron and boron. The driving device includes an inverter to perform field weakening control for the motor, thereby driving the motor at a variable speed; a first detector to output a first detection signal corresponding to a motor drive current supplied to the motor by the inverter; a protection level setting unit that sets an overcurrent protection level; a second detector to output a second detection signal corresponding to a driving state of the motor; and a control device. Immediately after the motor drive current corresponding to the first detection signal exceeds the overcurrent protection level, the control device executes first control to reduce the motor drive current. When the protection level setting unit reduces the overcurrent protection level to a new current level, based on the second detection signal, the control device executes second control to reduce the motor drive current to a level lower than the new current level.

A compressor according to another aspect of the present invention includes the driving device described above.

An air conditioner according to another aspect of the present invention includes the compressor described above.

With the driving device according to the present invention, the performance of the motor can be fully demonstrated throughout the operating temperature range of the motor. Further, high reliability of the operation of the motor can be secured.

With the compressor according to the present invention, the performance of the compressor can be fully demonstrated throughout the operating temperature range of the motor. Further, high reliability of the operation of the compressor can be secured since the reliability of the operation of the motor is high.

With the air conditioner according to the present invention, air-conditioning capacity can be fully demonstrated throughout the operating temperature range of the motor. Further, high reliability of the operation of the air conditioner can be secured since the reliability of the operation of the compressor is high.

DETAILED DESCRIPTION

A driving device, a compressor and an air conditioner according to an embodiment of the present invention will be described below with reference to the drawings. The driving device according to the embodiment is a device that drives a motor. The compressor according to the embodiment is a device including a motor and the driving device. The air conditioner according to the embodiment is a device including the compressor. The following embodiment is just an example and a variety of modifications are possible within the scope of the present invention.

(Motor 1)

Figure 1:
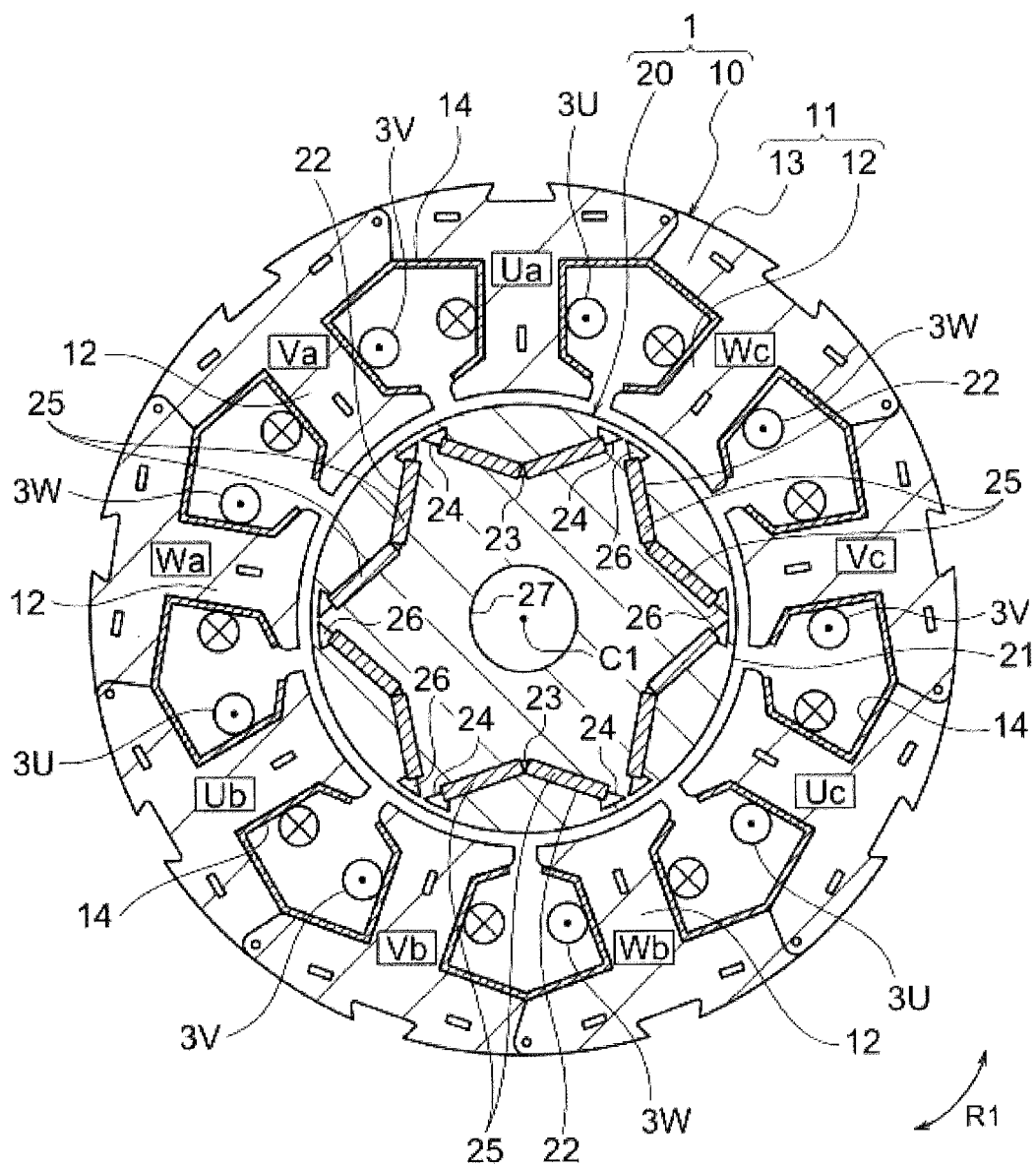
FIG. 1 is a cross-sectional view schematically showing the structure of a motor.

First, an example of a motor that is driven by the driving device according to the embodiment of the present invention will be described below. FIG. 1 is a cross-sectional view schematically showing the structure of a motor 1. FIG. 1 shows a cross section of a rotor 20 orthogonal to a rotation axis C1. As shown in FIG. 1, the motor 1 is a permanent magnet embedded motor. The motor 1 is installed in a compressor, for example. The motor 1 includes a stator 10 and the rotor 20 provided inside the stator 10 to be rotatable. Between the stator 10 and the rotor 20, an air gap that is 0.3 mm to 1 mm thick, for example, is formed.

An axial direction of the rotor 20 (direction parallel to the rotation axis C1) is referred to also as an "axial direction". Further, a direction R1 along an outer circumference (circumference) of the stator 10 or the rotor 20 is referred to also as a "circumferential direction". A direction of a radius of the stator 10 or the rotor 20 is referred to also as a "radial direction".

The stator 10 includes a stator core 11 and a coil 3 wound around the stator core 11. The stator core 11 is formed by stacking a plurality of electromagnetic steel sheets each 0.1 mm to 0.7 mm (0.35 mm in this example) thick in the axial direction and fastening the electromagnetic steel sheets together by crimping.

The stator core 11 includes a yoke part 13 in a ring-like shape and a plurality of (nine in this example) tooth parts 12 projecting inward in the radial direction from the yoke part 13. A slot is formed between adjacent tooth parts 12. Each tooth part 12 has a tooth end part with a greater width (dimension in the circumferential direction of the stator core 11) at its tip end inside in the radial direction.

Around each tooth part 12, the coil 3 (i.e., coil 3U, 3V, 3W) as a stator winding is wound via an insulator (isolator) 14. As the coil 3, magnet wire with a wire diameter (diameter) of 0.8 mm is wound around each tooth part 12 for 110 turns (110 times) by means of concentrated winding, for example. The number of turns and the wire diameter of the coil 3 are determined based on properties required of the motor 1 (revolution speed, output torque, etc.), supply voltage, or the cross-sectional area of the slot.

The coil 3 is formed of three-phase windings of a U phase, a V phase and a W phase (coils 3U, 3V and 3W). Both terminals of the coil 3 of each phase are open. Thus, the coil 3 has six terminals in total. The coil 3 is configured so that its connection condition can be switched between Y connection and delta connection as will be described later. The insulator 14 is formed of film made of PET (polyethylene terephthalate), for example. The thickness of the insulator 14 is 0.1 mm to 0.2 mm, for example.

The stator core 11 has a configuration in which a plurality of (nine in this example) blocks are connected together via thin-wall parts. The stator core 11 is formed by winding the magnet wire around each tooth part 12 in a state in which the stator core 11 is developed in a belt-like shape and thereafter bending the stator core 11 into a ring-like shape and welding its both ends together.

Forming the insulator 14 with thin film and employing dividable structure of the stator core 11 to facilitate the winding process as above is effective for increasing the number of turns of the coil 3 in the slot. Incidentally, the stator core 11 is not limited to one having the configuration in which a plurality of blocks (split cores) are connected together as above.

The rotor 20 includes a rotor core 21 and rare earth magnets 25 as permanent magnets attached to the rotor core 21. The rotor core 21 is formed by stacking a plurality of electromagnetic steel sheets each 0.1 mm to 0.7 mm (0.35 mm in this example) thick in the axial direction and fastening the electromagnetic steel sheets together by crimping.

The rotor core 21 is in a cylindrical shape and a shaft hole 27 (center hole) is formed at the center of the rotor core 21 in the radial direction. To the shaft hole 27, a shaft of the rotor 20 (shaft 90 shown in FIG. 2 which will be explained later) is fixed by means of shrink fitting, press fitting or the like.

A plurality of (six in this example) magnet insertion holes 22 in which the rare earth magnet 25 will be inserted are formed along an outer circumferential surface of the rotor core 21. The magnet insertion holes 22 are voids, and one magnet insertion hole 22 corresponds to one magnetic pole. In this example, six magnet insertion holes 22 are formed, and thus the total number of magnetic poles in the rotor 20 is six.

The magnet insertion hole 22 in this example has a V-shape in which a central part in the circumferential direction projects inward in the radial direction. Incidentally, the magnet insertion hole 22 is not limited to the V-shape and may also be in a different shape such as a straight shape.

Two rare earth magnets 25 are arranged in one magnet insertion hole 22. Namely, two rare earth magnets 25 are arranged per magnetic pole. In this example, a total of twelve rare earth magnets 25 are arranged in the rotor 20 since the total number of magnetic poles in the rotor 20 is six as mentioned above.

The rare earth magnet 25 is a planar member long-shaped in the axial direction of the rotor core 21, having a width in the circumferential direction of the rotor core 21 and a thickness in the radial direction. The rare earth magnet 25 is formed of a rare earth magnet containing neodymium (Nd), iron (Fe) and boron (B) as principal ingredients, for example.

The rare earth magnet 25 has been magnetized in its thickness direction. Further, the two rare earth magnets 25 arranged in one magnet insertion hole 22 have been magnetized so that magnetic poles identical with each other face the same side in the radial direction.

A flux barrier 26 is formed on each side of the magnet insertion hole 22 in the circumferential direction. The flux barrier 26 is a void formed continuously from the magnet insertion hole 22. The flux barrier 26 is a part for restraining leakage flux between adjacent magnetic poles (magnetic flux flowing through a part between poles).

In the rotor core 21, a first magnet holding part 23 as a projection is formed in a central part of each magnet insertion hole 22 in the circumferential direction. Further, in the rotor core 21, a second magnet holding part 24 as a projection is formed in each end part of the magnet insertion hole 22 in the circumferential direction. The first magnet holding part 23 and the second magnet holding parts 24 are parts for positioning and holding the rare earth magnet 25 in each magnet insertion hole 22.

As mentioned above, the number of slots (i.e., the number of tooth parts 12) in the stator 10 is nine and the number of poles in the rotor 20 is six. Thus, in the motor 1, the ratio between the number of poles in the rotor 20 and the number of slots in the stator 10 is 2:3.

While the connection condition of the coil 3 is switched between the Y connection and the delta connection in the motor 1, there is a possibility that circulating current flows and the performance of the motor 1 deteriorates when the delta connection is used. The circulating current is caused by the third harmonic occurring in an inductive voltage in the winding of each phase. In the case of the concentrated winding in which the ratio between the number of poles and the number of slots is 2:3, it is known that if there is no influence of magnetic saturation or the like, no third harmonic occurs in the inductive voltage and thus no performance deterioration due to circulating current occurs.

(Compressor 8)

Figure 2:
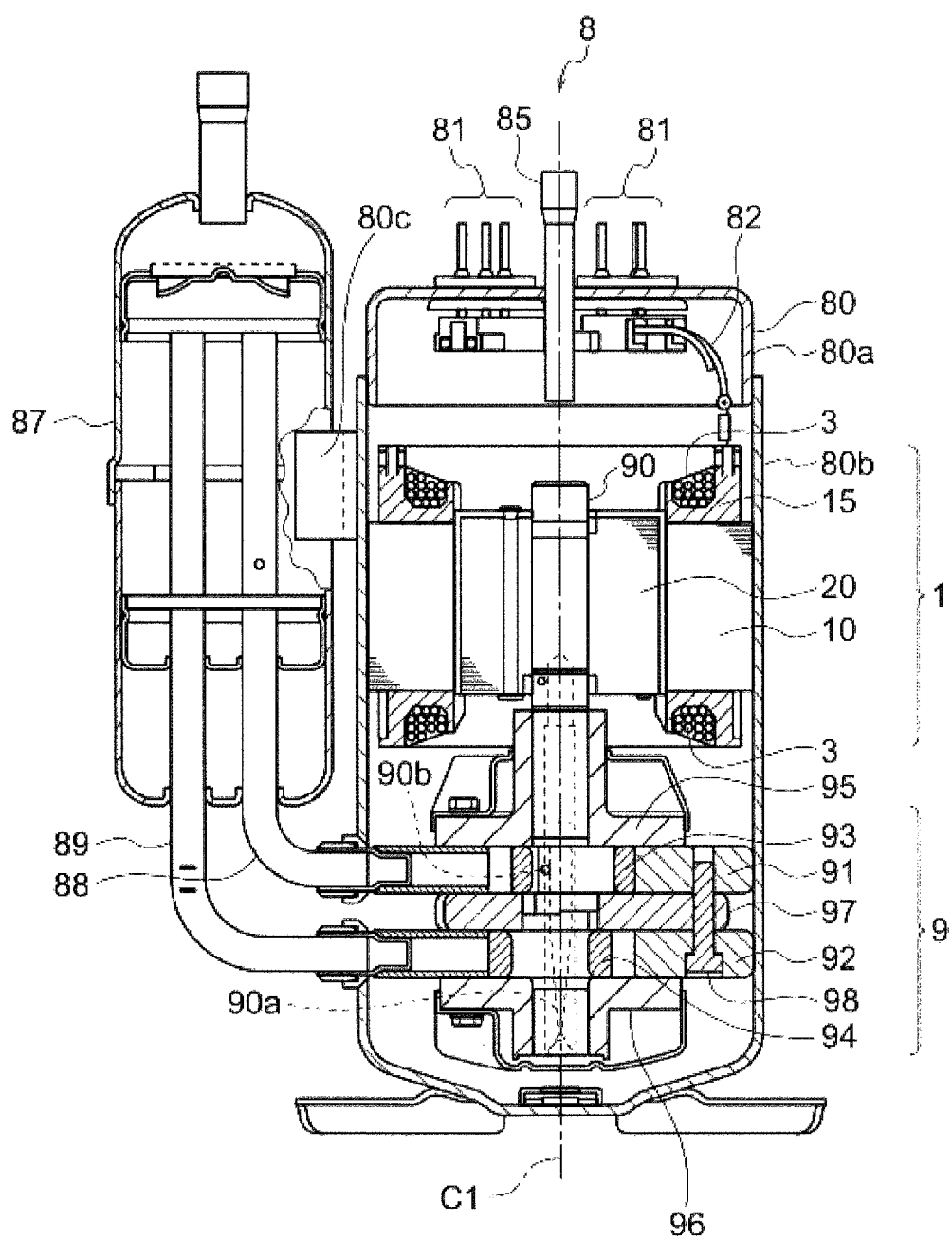
FIG. 2 is a cross-sectional view schematically showing the structure of a compressor.

Next, an example of a compressor including the motor 1 and the driving device according to the embodiment of the present invention will be described below. FIG. 2 is a cross-sectional view schematically showing the structure of a compressor 8 as a rotary compressor. The driving device is not shown in FIG. 2. As shown in FIG. 2, the compressor 8 includes a shell 80, a compression mechanism 9 provided in the shell 80, and the motor 1 that drives the compression mechanism 9. The compressor 8 further includes a shaft 90 (crank shaft) that connects the motor 1 and the compression mechanism 9 together so that motive power can be transmitted. The shaft 90 fits in the shaft hole 27 (shown in FIG. 1) of the rotor 20 of the motor 1.

The shell 80 is a hermetic container formed of a steel plate, for example, and covers the motor 1 and the compression mechanism 9. The shell 80 includes an upper shell 80a and a lower shell 80b. Attached to the upper shell 80a are a glass terminal 81 as a terminal part for supplying electric power from the outside of the compressor 8 to the motor 1 and a discharge pipe 85 for discharging a refrigerant compressed in the compressor 8 to the outside. In this example, a total of six lead wires corresponding to two U-phase windings, two V-phase windings and two W-phase windings of the coil 3 of the motor 1 are lead out from the glass terminal 81. The lower shell 80b houses the motor 1 and the compression mechanism 9.

The compression mechanism 9 includes a ring-shaped first cylinder 91 and a ring-shaped second cylinder 92 along the shaft 90. The first cylinder 91 and the second cylinder 92 are fixed to an inner circumferential part of the shell 80 (lower shell 80b). A ring-shaped first piston 93 is arranged on an inner circumferential side of the first cylinder 91, while a ring-shaped second piston 94 is arranged on an inner circumferential side of the second cylinder 92. The first piston 93 and the second piston 94 are rotary pistons rotating together with the shaft 90.

A partition plate 97 is provided between the first cylinder 91 and the second cylinder 92. The partition plate 97 is a disk-shaped member having a through hole at its center. In a cylinder chamber of each of the first cylinder 91 and the second cylinder 92, a vane (not shown) separating the cylinder chamber into an intake side and a compression side is provided. The first cylinder 91, the second cylinder 92 and the partition plate 97 are fixed together by using bolts 98.

An upper frame 95 is arranged on an upper side of the first cylinder 91 to seal the upper side of the cylinder chamber of the first cylinder 91. A lower frame 96 is arranged on a lower side of the second cylinder 92 to seal the lower side of the cylinder chamber of the second cylinder 92. The upper frame 95 and the lower frame 96 support the shaft 90 to be rotatable.

Refrigerator oil (not shown) for lubricating sliding parts of the compression mechanism 9 is stored in a bottom part of the lower shell 80b of the shell 80. The refrigerator oil ascends in a hole 90a formed in the axial direction in the shaft 90 and is supplied to the sliding parts from oil supply holes 90b formed at a plurality of points on the shaft 90.

The stator 10 of the motor 1 is mounted on the inside of the shell 80 by means of shrink fitting. To the coil 3 of the stator 10, electric power is supplied from the glass terminal 81 attached to the upper shell 80a. To the shaft hole 27 (shown in FIG. 1) of the rotor 20, the shaft 90 is fixed.

An accumulator 87 storing a refrigerant gas is attached to the shell 80. The accumulator 87 is held by a holding part 80c provided on an outer surface of the lower shell 80b, for example. A pair of intake pipes 88 and 89 are attached to the shell 80. The refrigerant gas is supplied from the accumulator 87 to the cylinders 91 and 92 via the intake pipes 88 and 89.

R410A, R407C, R22 or the like may be used as the refrigerant, for example. However, from the viewpoint of preventing global warming, it is desirable to use a low GWP (Global Warming Potential) refrigerant as the refrigerant. As the low GWP refrigerant, the following refrigerants (1) to (3) can be used, for example.

A refrigerant (1) is halogenated hydrocarbon containing a carbon double bond in the composition, e.g., HFO (Hydro-Fluoro-Orefin)-1234yf ($CF_3CF=CH_2$). The GWP of HFO-1234yf is 4.

A refrigerant (2) is hydrocarbon containing a carbon double bond in the composition, e.g., R1270 (propylene). The GWP of R1270 is 3, which is lower than that of HFO-1234yf; however, flammability is higher than that of HFO-1234yf.

A refrigerant (3) is a mixture containing at least either a halogenated hydrocarbon containing a carbon double bond in the composition or a hydrocarbon containing a carbon double bond in the composition, e.g., a mixture of HFO-1234yf and R32. The aforementioned HFO-1234yf is a low-pressure refrigerant, and thus tends to cause great pressure loss and can cause performance deterioration of a refrigeration cycle (especially, an evaporator). Thus, it is desirable from a practical viewpoint to use a mixture with R32 or R41 that is a high-pressure refrigerant relative to HFO-1234yf.

The basic operation of the compressor 8 is as follows: The refrigerant gas supplied from the accumulator 87 passes through the intake pipes 88 and 89 and is supplied to the cylinder chambers of the first cylinder 91 and the second cylinder 92. When the motor 1 is driven and the rotor 20 rotates, the shaft 90 rotates together with the rotor 20. Then, the first piston 93 and the second piston 94 fitted onto the shaft 90 rotate eccentrically in the cylinder chambers and thereby compress the refrigerant in the cylinder chambers. The compressed refrigerant ascends in the shell 80 through a hole (not shown) formed in the rotor 20 of the motor 1 and is discharged to the outside through the discharge pipe 85.

(Air Conditioner 5)

Figure 3:
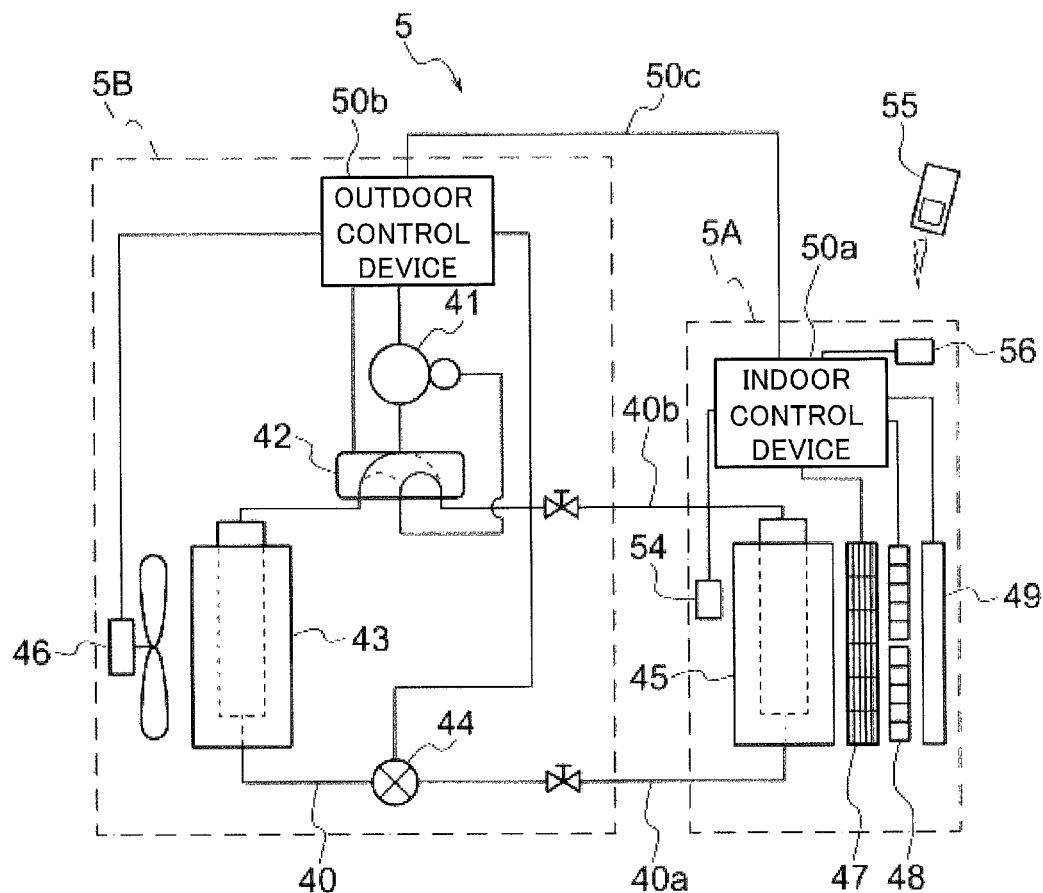
FIG. 3 is a diagram schematically showing a configuration of an air conditioner.

Next, an air conditioner 5 including the compressor will be described below. FIG. 3 is a diagram schematically showing the configuration of the air conditioner 5. The air conditioner 5 includes an indoor unit 5A installed in a room as an air conditioning object space and an outdoor unit 5B installed outdoors. The indoor unit 5A and the outdoor unit 5B are connected together by connection pipings 40a and 40b in which a refrigerant flows. In the connection piping 40a, a liquid refrigerant after passing through a condenser flows. In the connection piping 40b, a gas refrigerant after passing through an evaporator flows.

The outdoor unit 5B is provided with a compressor 41 that compresses the refrigerant and discharges the compressed refrigerant, a four-way valve (refrigerant channel selector valve) 42 that switches the flow direction of the refrigerant, an outdoor heat exchanger 43 that performs heat exchange between outside air and the refrigerant, and an expansion valve (decompression device) 44 that decompresses the high-pressure refrigerant into low pressure. The compressor 41 is formed with the aforementioned compressor 8 (shown in FIG. 2). The indoor unit 5A includes an indoor heat exchanger 45 that performs heat exchange between indoor air and the refrigerant.

The compressor 41, the four-way valve 42, the outdoor heat exchanger 43, the expansion valve 44 and the indoor heat exchanger 45 are connected together by piping 40 including the aforementioned connection pipings 140a and 140b to form a refrigerant circuit. With these components, a compression refrigeration cycle (i.e., compression heat pump cycle) in which the refrigerant is circulated with the compressor 41 is formed.

To control the operation of the air conditioner 5, an indoor control device 50a is arranged in the indoor unit 5A and an outdoor control device 50b is arranged in the outdoor unit 5B. Each of the indoor control device 50a and the outdoor control device 50b includes a control board on which various circuits for controlling the air conditioner 5 have been formed. The indoor control device 50a and the outdoor control device 50b are connected to each other by a communication cable 50c (shown in FIG. 4 which will be explained later). The communication cable 50c is bundled together with the aforementioned connection pipings 40a and 40b.

In the outdoor unit 5B, an outdoor blower fan 46 as a blower is arranged to face the outdoor heat exchanger 43. The outdoor blower fan 46 rotates and thereby generates an airflow passing through the outdoor heat exchanger 43. The outdoor blower fan 46 is formed with a propeller fan, for example.

The four-way valve 42 is controlled by the outdoor control device 50b and switches the direction in which the refrigerant flows. When the four-way valve 42 is at the position indicated by the solid line in FIG. 3, the gas refrigerant discharged from the compressor 41 is sent to the outdoor heat exchanger 43 (condenser). In contrast, when the four-way valve 42 is at the position indicated by the broken line in FIG. 3, the gas refrigerant flowing in from the outdoor heat exchanger 43 (evaporator) is sent to the compressor 41. The expansion valve 44 is controlled by the outdoor control device 50b and decompresses the high-pressure refrigerant into low pressure by changing its opening degree.

In the indoor unit 5A, an indoor blower fan 47 as a blower is arranged to face the indoor heat exchanger 45. The indoor blower fan 47 rotates and thereby generates an airflow passing through the indoor heat exchanger 45. The indoor blower fan 47 is formed with a cross flow fan, for example.

The indoor unit 5A is provided with an indoor temperature sensor 54 as a temperature sensor that measures an indoor temperature Ta as an air temperature in the room as the air conditioning object space and sends temperature information (i.e., information signal) obtained by the measurement to the indoor control device 50a. The indoor temperature sensor 54 may be formed with a temperature sensor used for standard air conditioners, or may also be a radiation temperature sensor that detects a surface temperature of a wall, floor or the like in the room.

The indoor unit 5A is further provided with a signal reception unit 56 that receives a command signal (i.e., operation command signal) transmitted from a remote control 55 as a remote control device operated by the user. With the remote control 55, the user makes operation inputs (e.g., operation start and stoppage) or issues commands in regard to the operation (e.g., set temperature, air speed, etc.) to the air conditioner 5.

The compressor 41 is configured to be able to vary the operating revolution speed in a range of 20 [rps] to 130 [rps] in normal operation. As the revolution speed of the compressor 41 increases, refrigerant circulation volume of the refrigerant circuit increases. The revolution speed of the compressor 41 is controlled by a control device 50 (specifically, the outdoor control device 50b) based on a temperature difference $\Delta T$ between the present indoor temperature Ta obtained by the indoor temperature sensor 54 and the set temperature Ts set by the user through the remote control 55. As the temperature difference $\Delta T$ increases, the compressor 41 rotates at higher revolution speed and increases the circulation volume of the refrigerant.

The rotation of the indoor blower fan 47 is controlled by the indoor control device 50a. The revolution speed of the indoor blower fan 47 can be switched in multiple steps. In this example, the revolution speed can be switched in three steps of high, middle and low, for example. When the air speed setting has been set at an automatic mode by using the remote control 55, the revolution speed of the indoor blower fan 47 is switched based on the temperature difference $\Delta T$ between the measured indoor temperature Ta and the set temperature Ts.

The rotation of the outdoor blower fan 46 is controlled by the outdoor control device 50b. The revolution speed of the outdoor blower fan 46 can be switched in multiple steps. In this example, the revolution speed of the outdoor blower fan 46 is switched based on the temperature difference $\Delta T$ between the measured indoor temperature Ta and the set temperature Ts.

The indoor unit 5A further includes a horizontal air direction plate 48 and a vertical air direction plate 49. The horizontal air direction plate 48 and the vertical air direction plate 49 change a blow-out direction of the conditioned air after undergoing the heat exchange by the indoor heat exchanger 45 when the conditioned air is blown out by the indoor blower fan 47 into the inside of the room. The horizontal air direction plate 48 changes the blow-out direction horizontally, while the vertical air direction plate 49 changes the blow-out direction vertically. The angle of each of the horizontal air direction plate 48 and the vertical air direction plate 49, namely, the air direction of an airflow blown out is controlled by the indoor control device 50a based on a setting made through the remote control 55.

The basic operation of the air conditioner 5 is as follows: In the cooling operation, the four-way valve 42 is switched to the position indicated by the solid line and the high-temperature and high-pressure gas refrigerant discharged from the compressor 41 flows into the outdoor heat exchanger 43. In this case, the outdoor heat exchanger 43 operates as a condenser. When air passes through the outdoor heat exchanger 43 due to the rotation of the outdoor blower fan 46, the air absorbs condensation heat of the refrigerant by means of heat exchange. The refrigerant is condensed into a high-pressure and low-temperature liquid refrigerant and then adiabatically expanded by the expansion valve 44 into a low-pressure and low-temperature two-phase refrigerant.

The refrigerant that passed through the expansion valve 44 flows into the indoor heat exchanger 45 of the indoor unit 5A. The indoor heat exchanger 45 operates as an evaporator. When air passes through the indoor heat exchanger 45 due to the rotation of the indoor blower fan 47, evaporation heat is absorbed by the refrigerant by means of heat exchange, and the air cooled down by the heat exchange is supplied to the inside of the room. The refrigerant evaporates into a low-temperature and low-pressure gas refrigerant and is then compressed again by the compressor 41 into the high-temperature and high-pressure refrigerant.

In the heating operation, the four-way valve 42 is switched to the position indicated by the dotted line and the high-temperature and high-pressure gas refrigerant discharged from the compressor 41 flows into the indoor heat exchanger 45. In this case, the indoor heat exchanger 45 operates as a condenser. When air passes through the indoor heat exchanger 45 due to the rotation of the indoor blower fan 47, the air absorbs condensation heat from the refrigerant by means of heat exchange, and the air heated by the heat exchange is supplied to the inside of the room. The refrigerant is condensed into a high-pressure and low-temperature liquid refrigerant and then adiabatically expanded by the expansion valve 44 into a low-pressure and low-temperature two-phase refrigerant.

The refrigerant that passed through the expansion valve 44 flows into the outdoor heat exchanger 43 of the outdoor unit 5B. The outdoor heat exchanger 43 operates as an evaporator. When air passes through the outdoor heat exchanger 43 due to the rotation of the outdoor blower fan 46, evaporation heat is absorbed by the refrigerant by means of heat exchange. The refrigerant evaporates into a low-temperature and low-pressure gas refrigerant and is then compressed again by the compressor 41 into the high-temperature and high-pressure refrigerant.

Figure 4:
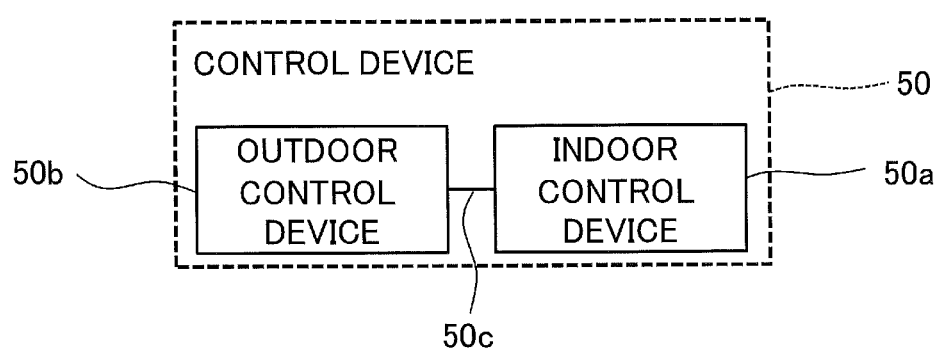
FIG. 4 is a conceptual diagram showing a basic configuration of a control system of the air conditioner.

FIG. 4 is a conceptual diagram showing a basic configuration of a control system of the air conditioner 5. The aforementioned indoor control device 50a and outdoor control device 50b control the air conditioner 5 while exchanging information with each other via the communication cable 50c. The indoor control device 50a and the outdoor control device 50b will hereinafter be referred to collectively as the control device 50.

Figure 5:
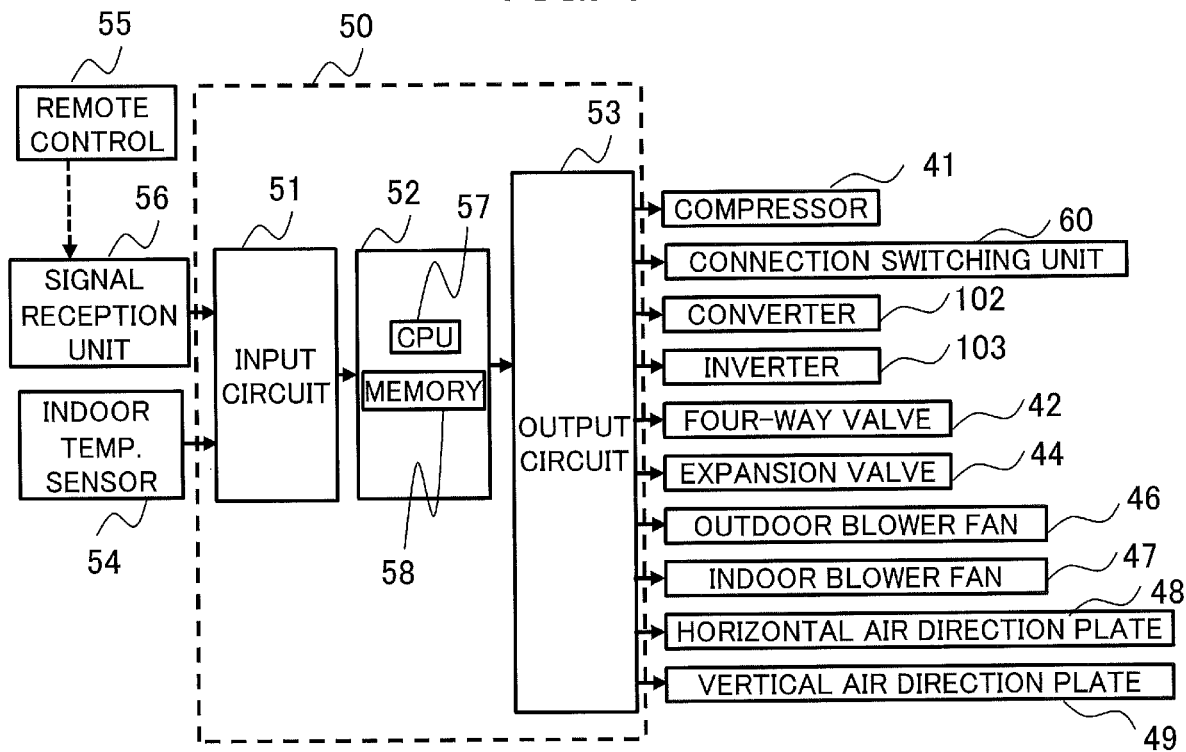
FIG. 5 is a block diagram schematically showing a configuration of the control system of the air conditioner.

FIG. 5 is a block diagram schematically showing a configuration of the control system of the air conditioner 5. The control device 50 is formed with a microcomputer, for example. An input circuit 51, an arithmetic circuit 52 and an output circuit 53 have been installed in the control device 50.

To the input circuit 51, the command signal received by the signal reception unit 56 from the remote control 55 is inputted. The command signal includes a signal for setting an operation input, an operation mode, the set temperature, an air flow rate or the air direction, for example. The temperature information indicating the indoor temperature detected by the indoor temperature sensor 54 is also inputted to the input circuit 51. The input circuit 51 outputs these pieces of input information to the arithmetic circuit 52.

The arithmetic circuit 52 includes a CPU (Central Processing Unit) 57 and a memory 58. The CPU 57 is a processor that performs arithmetic processing and judgment processing. The memory 58 is a storage unit that stores various types of set values and programs to be used for the control of the air conditioner 5. The arithmetic circuit 52 performs computation and judgment based on the information inputted from the input circuit 51 and outputs the result to the output circuit 53.

The output circuit 53 outputs control signals to the compressor 41, a connection switching unit 60, a converter 102, an inverter 103, the four-way valve 42, the expansion valve 44, the outdoor blower fan 46, the indoor blower fan 47, the horizontal air direction plate 48 and the vertical air direction plate 49 based on the information inputted from the arithmetic circuit 52.

As mentioned earlier, the indoor control device 50a and the outdoor control device 50b (FIG. 4) control various types of devices in the indoor unit 5A and the outdoor unit 5B while exchanging information with each other via the communication cable 50c. Actually, each of the indoor control device 50a and the outdoor control device 50b is formed with a microcomputer including a memory storing a program and a CPU as a processor that executes the program. Incidentally, it is also possible to install the control device in only one of the indoor unit 5A and the outdoor unit 5B and make the control device control the various types of devices in the indoor unit 5A and the outdoor unit 5B.

Figure 6:
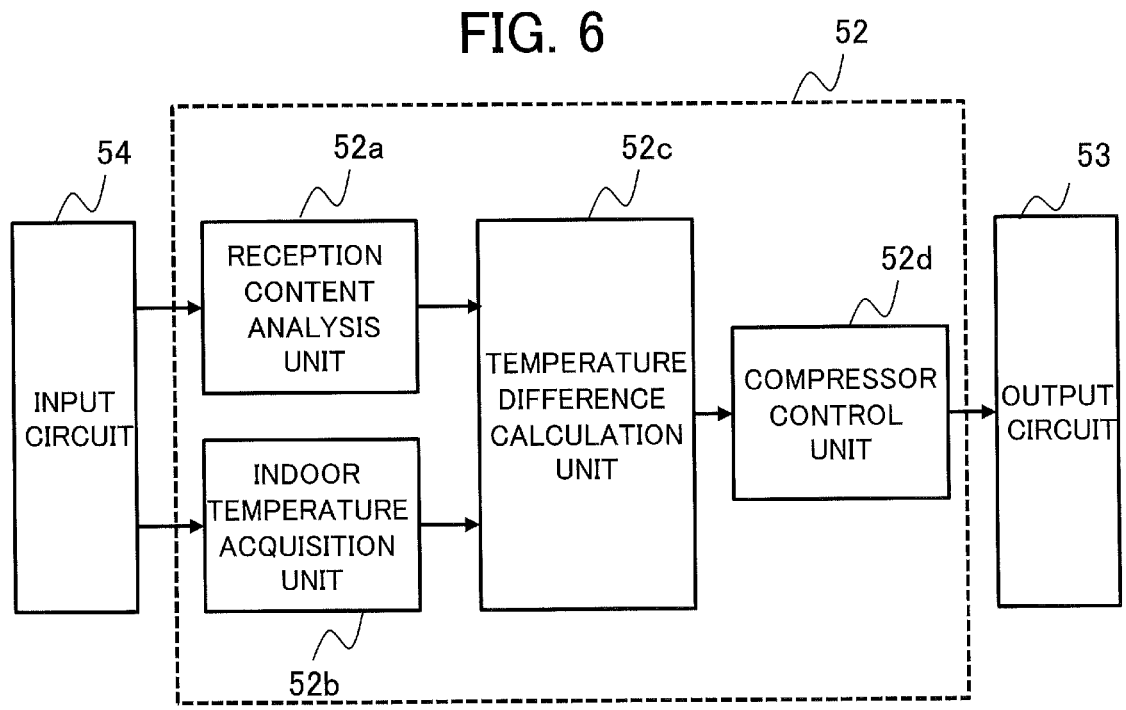
FIG. 6 is a block diagram showing a part of a control device of the air conditioner for controlling the motor of the compressor.

FIG. 6 is a block diagram showing a part of the control device 50 for controlling the motor 1 of the compressor 41 based on the indoor temperature Ta. The arithmetic circuit 52 of the control device 50 includes a reception content analysis unit 52a, an indoor temperature acquisition unit 52b, a temperature difference calculation unit 52c and a compressor control unit 52d. These units are included in the CPU 57 of the arithmetic circuit 52, for example.

The reception content analysis unit 52a analyzes the command signal inputted from the remote control 55 via the signal reception unit 56 and the input circuit 51. Based on the result of the analysis, the reception content analysis unit 52a outputs the operation mode and the set temperature Ts, for example, to the temperature difference calculation unit 52c. The indoor temperature acquisition unit 52b acquires the indoor temperature Ta inputted from the indoor temperature sensor 54 via the input circuit 51 and outputs the indoor temperature Ta to the temperature difference calculation unit 52c.

The temperature difference calculation unit 52c calculates the temperature difference ΔT between the indoor temperature Ta inputted from the indoor temperature acquisition unit 52b and the set temperature Ts inputted from the reception content analysis unit 52a. When the operation mode inputted from the reception content analysis unit 52a is the heating operation, the temperature difference ΔT is calculated as Ts−Ta. When the operation mode is the cooling operation, the temperature difference ΔT is calculated as Ta−Ts. The temperature difference calculation unit 52c outputs the calculated temperature difference ΔT to the compressor control unit 52d.

The compressor control unit 52d controls a driving device 100 based on the temperature difference ΔT inputted from the temperature difference calculation unit 52c and thereby controls the revolution speed of the motor 1 (i.e., the revolution speed of the compressor 41).

(Basic Configuration of Driving Device 100)

Figure 7:
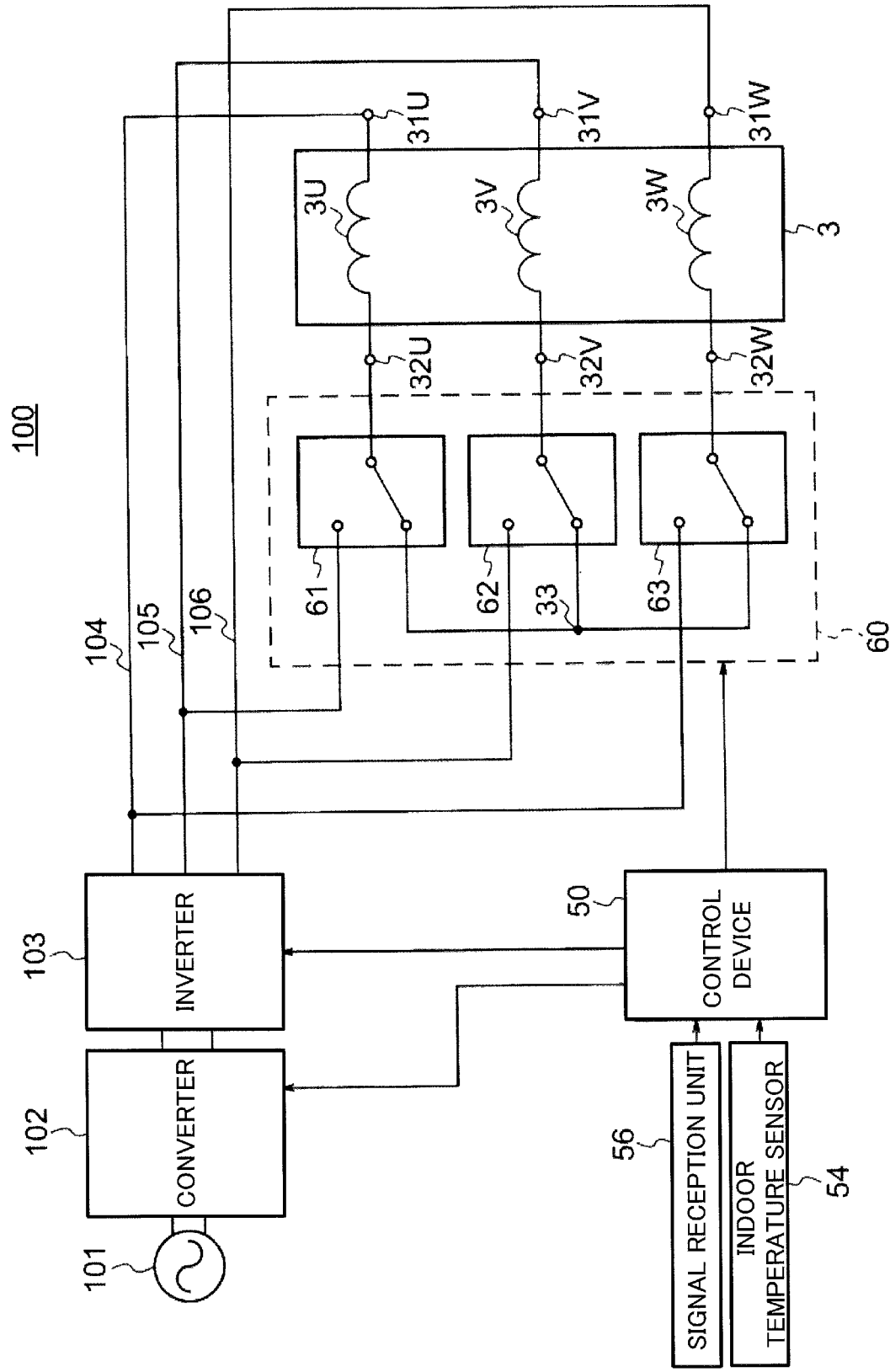
FIG. 7 is a diagram schematically showing a basic configuration of a driving device in which a connection condition of a coil of a stator of the motor has been set to Y connection.

Next, the driving device of the motor 1 will be described below. FIG. 7 is a diagram schematically showing a basic configuration of a common type of driving device 100. The driving device 100 is configured to include the converter 102 that rectifies output power of an AC power supply 101, the inverter 103 that applies AC voltage to the coil 3 of the motor 1, the connection switching unit 60 that switches the connection condition of the coil 3, and the control device 50. To the converter 102, electric power is supplied from the AC power supply 101 that is an alternating current (AC) power supply.

The AC power supply 101 is an AC power supply of 200 V (effective voltage), for example. The converter 102 is a rectifier circuit and outputs a direct current (DC) voltage of 280 V, for example. The voltage outputted from the converter 102 is referred to as bus voltage. The inverter 103 is supplied with the bus voltage from the converter 102 and outputs line-to-line voltage (referred to also as motor voltage) to the coil 3 of the motor 1. Accordingly, a motor driving current Io (in other words, driving electric power) is supplied to the coil 3 as the stator wining of the motor 1. To the inverter 103, wirings 104, 105 and 106 respectively connected to the coils 3U, 3V and 3W are connected.

The coil 3U has terminals 31U and 32U. The coil 3V has terminals 31V and 32V. The coil 3W has terminals 31W and 32W. The wiring 104 is connected to the terminal 31U of the coil 3U. The wiring 105 is connected to the terminal 31V of the coil 3V. The wiring 106 is connected to the terminal 31W of the coil 3W.

The connection switching unit 60 includes switches 61, 62 and 63. The switch 61 connects the terminal 32U of the coil 3U to either the wiring 105 or a neutral point 33. The switch 62 connects the terminal 32V of the coil 3V to either the wiring 106 or the neutral point 33. The switch 63 connects the terminal 32W of the coil 3W to either the wiring 104 or the neutral point 33. The switches 61, 62 and 63 of the connection switching unit 60 are formed with relay contacts. However, the switches 61, 62 and 63 may be formed with semiconductor switches.

The control device 50 controls the converter 102, the inverter 103 and the connection switching unit 60. The configuration of the control device 50 is as described with reference to FIG. 5. The operation command signal from the remote control 55 received by the signal reception unit 56 and the indoor temperature detected by the indoor temperature sensor 54 are inputted to the control device 50. Based on these pieces of input information, the control device 50 outputs a voltage switching signal to the converter 102, outputs an inverter driving signal to the inverter 103, and outputs a connection switching signal to the connection switching unit 60.

In the condition shown in FIG. 7, the switch 61 is connecting the terminal 32U of the coil 3U to the neutral point 33, the switch 62 is connecting the terminal 32V of the coil 3V to the neutral point 33, and the switch 63 is connecting the terminal 32W of the coil 3W to the neutral point 33. Namely, the terminals 31U, 31V and 31W of the coils 3U, 3V and 3W are connected to the inverter 103, and the terminals 32U, 32V and 32W of the coils 3U, 3V and 3W are connected to the neutral point 33.

Figure 8:
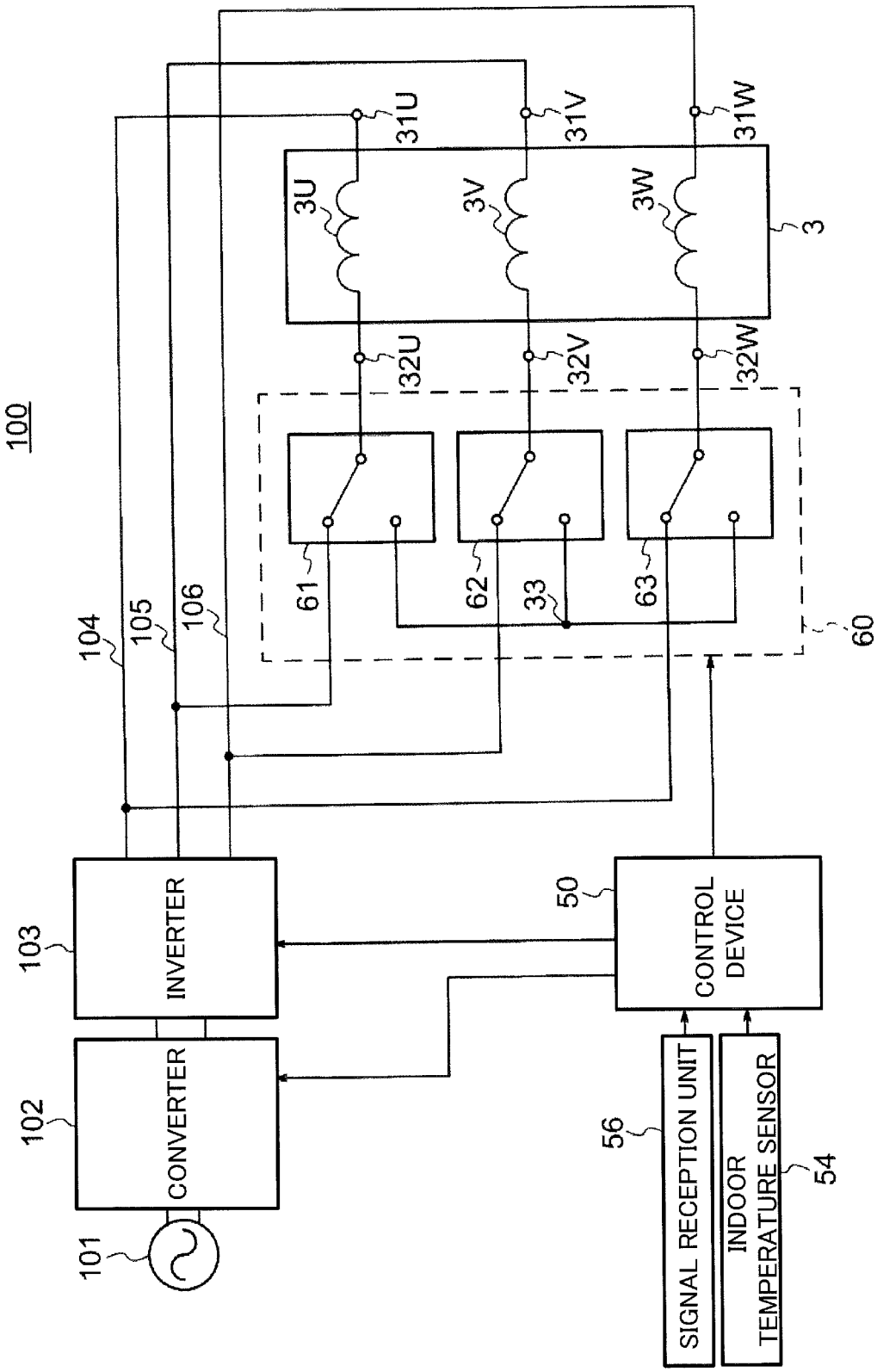
FIG. 8 is a diagram schematically showing a basic configuration of the driving device in which the connection condition of the coil of the stator of the motor has been set to delta (Δ) connection.

FIG. 8 is a diagram showing a condition of the common type of driving device 100 in which the switches 61, 62 and 63 of the connection switching unit 60 have been switched. In the condition shown in FIG. 8, the switch 61 is connecting the terminal 32U of the coil 3U to the wiring 105, the switch 62 is connecting the terminal 32V of the coil 3V to the wiring 106, and the switch 63 is connecting the terminal 32W of the coil 3W to the wiring 104.

Figure 9A:
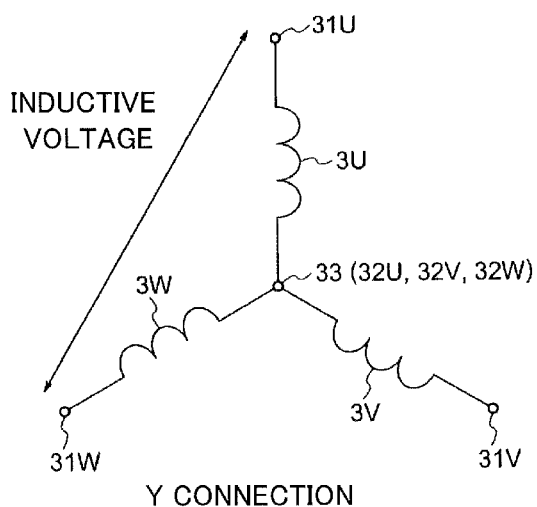
FIG. 9(A) is a schematic diagram showing a connection condition of coils when a connection switching unit is in a condition shown in FIG. 7.

FIG. 9(A) is a schematic diagram showing the connection condition of the coils 3U, 3V and 3W when the switches 61, 62 and 63 are in the condition shown in FIG. 7. The coils 3U, 3V and 3W are connected to the neutral point 33 at their respective terminals 32U, 32V and 32W. Accordingly, the connection condition of the coils 3U, 3V and 3W is set to the Y connection (star connection).

Figure 9B:
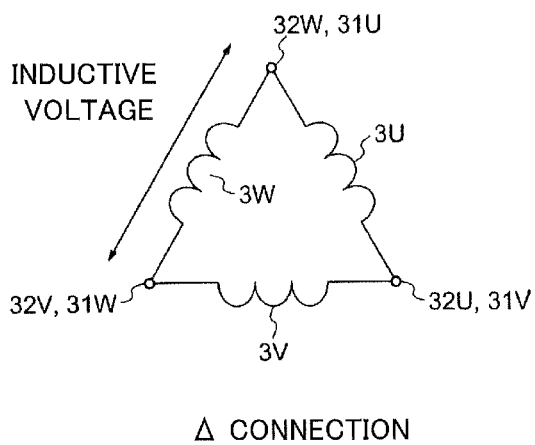
FIG. 9(B) is a schematic diagram showing a connection condition of the coils when the connection switching unit is in a condition shown in FIG. 8.

FIG. 9(B) is a schematic diagram showing the connection condition of the coils 3U, 3V and 3W when the switches 61, 62 and 63 are in the condition shown in FIG. 8. The terminal 32U of the coil 3U is connected to the terminal 31V of the coil 3V via the wiring 105 (FIG. 8). The terminal 32V of the coil 3V is connected to the terminal 31W of the coil 3W via the wiring 106 (FIG. 8). The terminal 32W of the coil 3W is connected to the terminal 31U of the coil 3U via the wiring 104 (FIG. 8). Accordingly, the connection condition of the coils 3U, 3V and 3W is set to the delta connection (triangle connection).

As above, the connection switching unit 60 is capable of switching the connection condition of the coils 3U, 3V and 3W of the motor 1 between the Y connection (first connection condition) and the delta connection (second connection condition) by the switching of the switches 61, 62 and 63.

Figure 10:
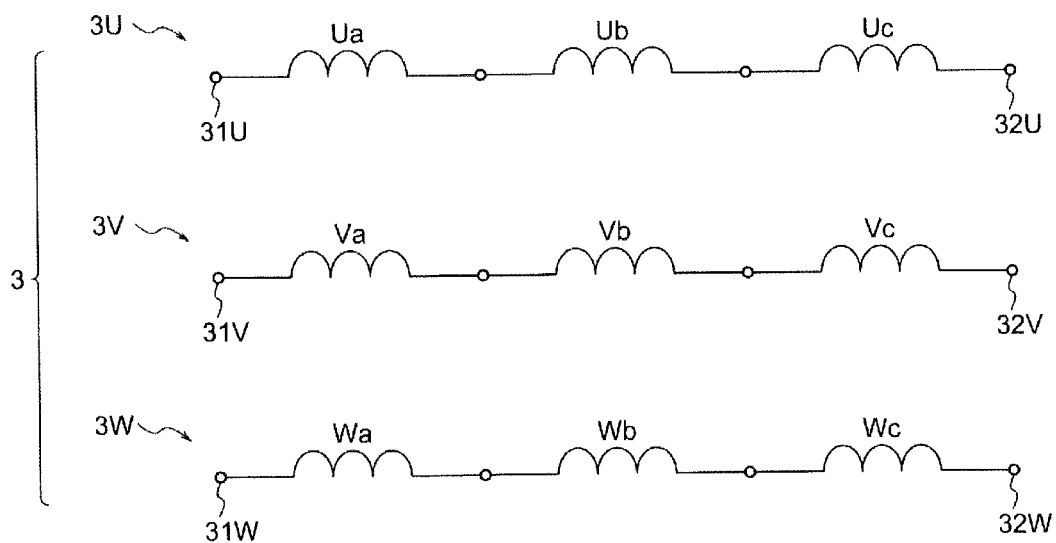
FIG. 10 is a schematic diagram showing coil parts each of three-phase coils.

FIG. 10 is a schematic diagram showing coil parts of each of the coils 3U, 3V and 3W. As mentioned earlier, the motor 1 includes nine tooth parts 12 (FIG. 1) and each coil 3U, 3V, 3W is wound around three tooth parts 12. Namely, the coil 3U is a series connection of U-phase coil parts Ua, Ub and Uc wound around three tooth parts 12. Similarly, the coil 3V is a series connection of V-phase coil parts Va, Vb and Vc wound around three tooth parts 12. Similarly, the coil 3W is a series connection of W-phase coil parts Wa, Wb and Wc wound around three tooth parts 12.

(Switching Between Y-Delta Connections)

In the motor 1 including the rotor 20 provided with the rare earth magnets 25, when the rotor 20 rotates, magnetic flux of the rare earth magnet 25 links with the coil 3 of the stator 10. Consequently, inductive voltage occurs in the coil 3. The inductive voltage is proportional to the number of revolutions of the rotor 20 per unit time (i.e., revolution speed) and is also proportional to the number of turns of the coil 3. The inductive voltage increases, as the revolution speed of the motor 1 and the number of turns of the coil 3 increase.

The line-to-line voltage outputted from the inverter 103 (motor voltage) equals the sum of the aforementioned inductive voltage and voltage caused by resistance and inductance of the coil 3. The line-to-line voltage is practically governed by the inductive voltage since the resistance and the inductance of the coil 3 are negligibly low as compared with the inductive voltage. Further, magnet torque of the motor 1 is proportional to the product of the inductive voltage and the current flowing through the coil 3.

The inductive voltage increases, as the number of turns of the coil 3 increases. Thus, as the number of turns of the coil 3 increases, the current for generating necessary magnet torque, that is, the motor driving current Io, is allowed to be lower. As a result, the loss caused by the energization of the inverter 103 can be reduced and the operating efficiency of the motor 1 can be increased. On the other hand, due to the increase in the inductive voltage, the line-to-line voltage governed by the inductive voltage reaches inverter maximum output voltage (i.e., the bus voltage supplied from the converter 102 to the inverter 103) at a lower revolution speed and the revolution speed cannot be increased over that revolution speed.

If the number of turns of the coil 3 is decreased, the inductive voltage decreases, and thus the line-to-line voltage governed by the inductive voltage does not reach the inverter maximum output voltage until a higher revolution speed and high speed rotation becomes possible. However, since the current for generating the necessary magnet torque increases due to the decrease in the inductive voltage, the loss caused by the energization of the inverter 103 increases and the operating efficiency of the motor 1 decreases.

Further, from the viewpoint of the switching frequency of the inverter 103, the line-to-line voltage being closer to the inverter maximum output voltage decreases harmonic components caused by the ON/OFF duty of the switching of the inverter 103, by which iron loss caused by the harmonic components of the current can be reduced.

Figure 11:
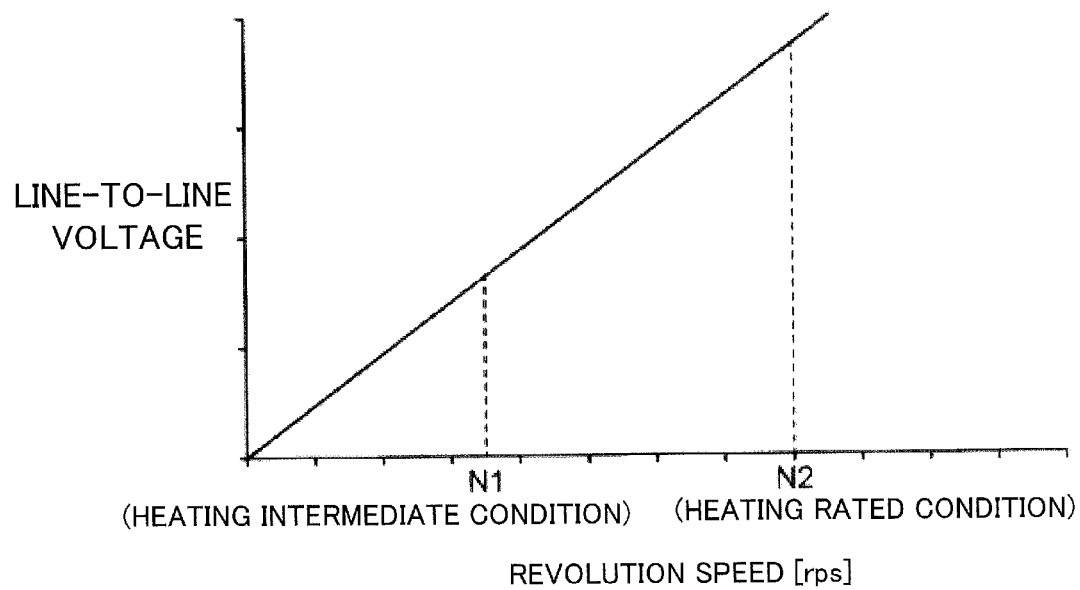
FIG. 11 is a graph showing a relationship between line-to-line voltage and revolution speed in the motor of a compressor of an air conditioner.
Figure 12:
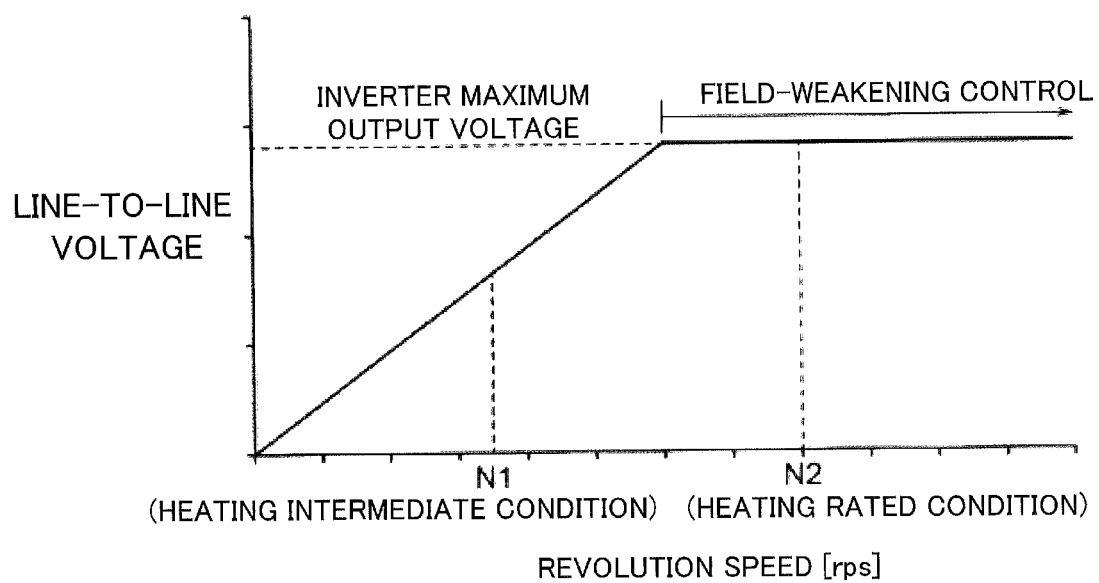
FIG. 12 is a graph showing a relationship between the line-to-line voltage and the revolution speed in the motor of the compressor of the air conditioner (when undergoing field-weakening control).

FIG. 11 and FIG. 12 are graphs showing a relationship between the line-to-line voltage and the revolution speed in the motor 1 of a compressor of an air conditioner. The connection condition of the coil 3 is assumed to be the Y connection. The line-to-line voltage is proportional to the product of the field-magnet magnetic field and the revolution speed. If the field-magnet magnetic field is constant, the line-to-line voltage is proportional to the revolution speed as shown in FIG. 11. Incidentally, in FIG. 11, the revolution speed N1 corresponds to a heating intermediate condition and the revolution speed N2 corresponds to a heating rated condition.

While the line-to-line voltage also increases with the increase in the revolution speed, the field-weakening control by the inverter 103 is started as shown in FIG. 12 when the line-to-line voltage reaches the inverter maximum output voltage since the line-to-line voltage cannot be increased over the inverter maximum output voltage. FIG. 12 shows an example in which the field-weakening control is started at a revolution speed between the revolution speeds N1 and N2.

In the field-weakening control, the inductive voltage is weakened by feeding a current in a d-axis phase (i.e., a current that causes magnetic flux in a direction of canceling the magnetic flux of the rare earth magnet 25) through the coil 3. This current is referred to as a weakening current. Since it is necessary to feed the weakening current in addition to the current for generating the normal motor torque, copper loss caused by the resistance of the coil 3 increases and the energization loss of the inverter 103 also increases.

Figure 13:
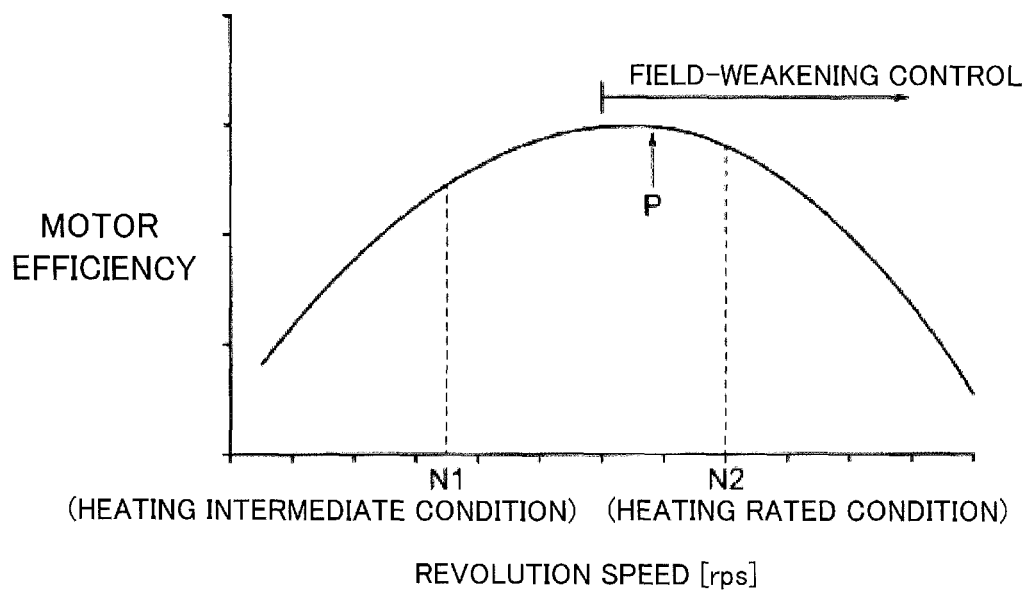
FIG. 13 is a graph showing a relationship between motor efficiency and the revolution speed when the field-weakening control shown in FIG. 12 is performed.

FIG. 13 is a graph showing a relationship between the motor efficiency and the revolution speed when the field-weakening control shown in FIG. 12 is performed. As shown in FIG. 13, the motor efficiency increases together with the revolution speed and reaches a peak immediately after the start of the field-weakening control as indicated by the arrow P.

As the revolution speed increases further, the weakening current fed through the coil 3 also increases, and thus the copper loss caused by the weakening current increases and the motor efficiency decreases. Incidentally, overall efficiency as the product of the motor efficiency and the inverter efficiency also shows a change represented by a curved line similar to the curved line shown in FIG. 13.

Figure 14:
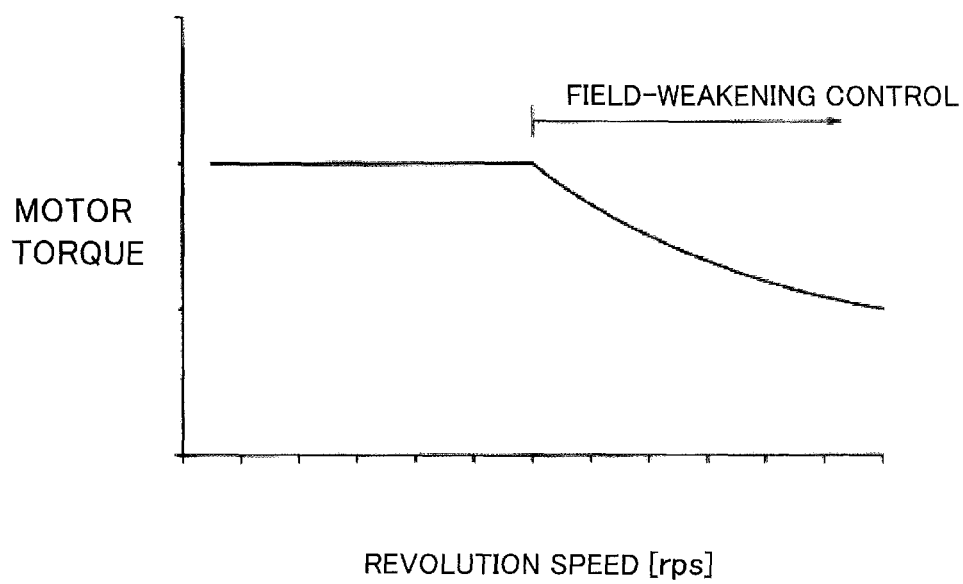
FIG. 14 is a graph showing a relationship between maximum output torque (i.e., motor torque) and the revolution speed of the motor when the field-weakening control shown in FIG. 12 is performed.

FIG. 14 is a graph showing a relationship between maximum output torque and the revolution speed of the motor 1 when the field-weakening control shown in FIG. 12 is performed. Before the field-weakening control is started, the maximum output torque of the motor 1 is constant (due to restriction by a current threshold value, for example). When the field-weakening control is started, the maximum output torque of the motor 1 decreases with the increase in the revolution speed. The maximum output torque of the motor 1 has been set to be higher than the load actually generated by (the load required of) the motor 1 when the product is used. The maximum output torque of the motor 1 will hereinafter be referred to also as "motor torque" for convenience of explanation.

Figure 15:
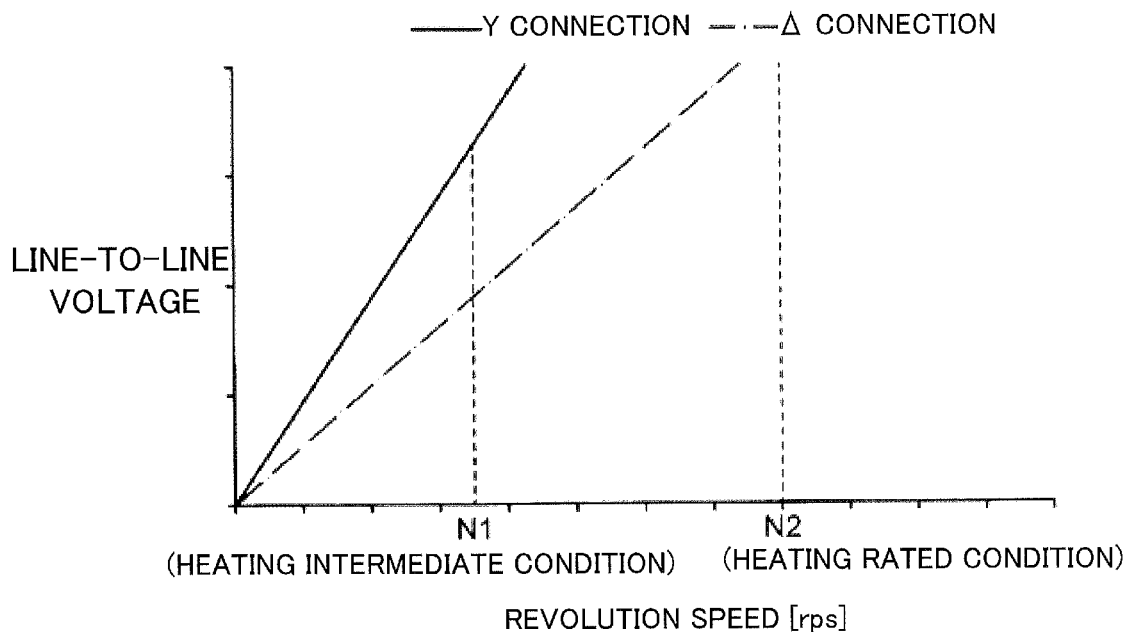
FIG. 15 is a graph showing a relationship between the line-to-line voltage and the revolution speed in regard to each of the Y connection and the delta connection.

FIG. 15 is a graph showing a relationship between the line-to-line voltage and the revolution speed in regard to each of the Y connection and the delta connection. Phase impedance of the coil 3 when the connection condition of the coil 3 is the delta connection is $1/\sqrt{3}$ times that when the connection condition of the coil 3 is the Y connection assuming that the number of turns is the same. Accordingly, interphase voltage when the connection condition of the coil 3 is the delta connection (chain line) is 1/A/3 times that when the connection condition of the coil 3 is the Y connection (solid line) assuming that the revolution speed is the same.

Thus, when connection condition of the coil 3 is the delta connection, if the number of turns is set at A/3 times that in the case of Y connection, the line-to-line voltage (motor voltage) becomes equivalent to that in the case of Y connection for the same revolution speed N, and accordingly, the output current of the inverter 103 also becomes equivalent to that in the case of Y connection.

In the motor 1 in which the number of turns of the coil 3 around a tooth part is some tens of turns or more, the Y connection is often employed rather than the delta connection for the following reasons: As the first reason, since the delta connection has a greater number of turns of the coil 3 compared to the Y connection, it takes a long time for winding the coil 3 in the manufacturing process. As the second reason, in the case of delta connection, there is a possibility of occurrence of circulating current.

In general, in motors 1 employing the Y connection, the number of turns of the coil 3 is adjusted so that the line-to-line voltage (motor voltage) reaches the inverter maximum output voltage at the revolution speed N2 (i.e., the revolution speed on the high-speed side in the revolution speeds as targets of performance improvement). In this case, however, at the revolution speed N1 (i.e., the revolution speed on the low-speed side in the revolution speeds as targets of performance improvement), the motor 1 is operated in a state in which the line-to-line voltage is lower than the inverter maximum output voltage and it is difficult to obtain high motor efficiency.

Therefore, specific control is being performed in which the connection condition of the coil 3 is set to the Y connection, the number of turns is adjusted so that the line-to-line voltage reaches the inverter maximum output voltage at a revolution speed slightly lower than the revolution speed N1, and the connection condition of the coil 3 is switched to the delta connection before the revolution speed reaches the revolution speed N2.

Figure 16:
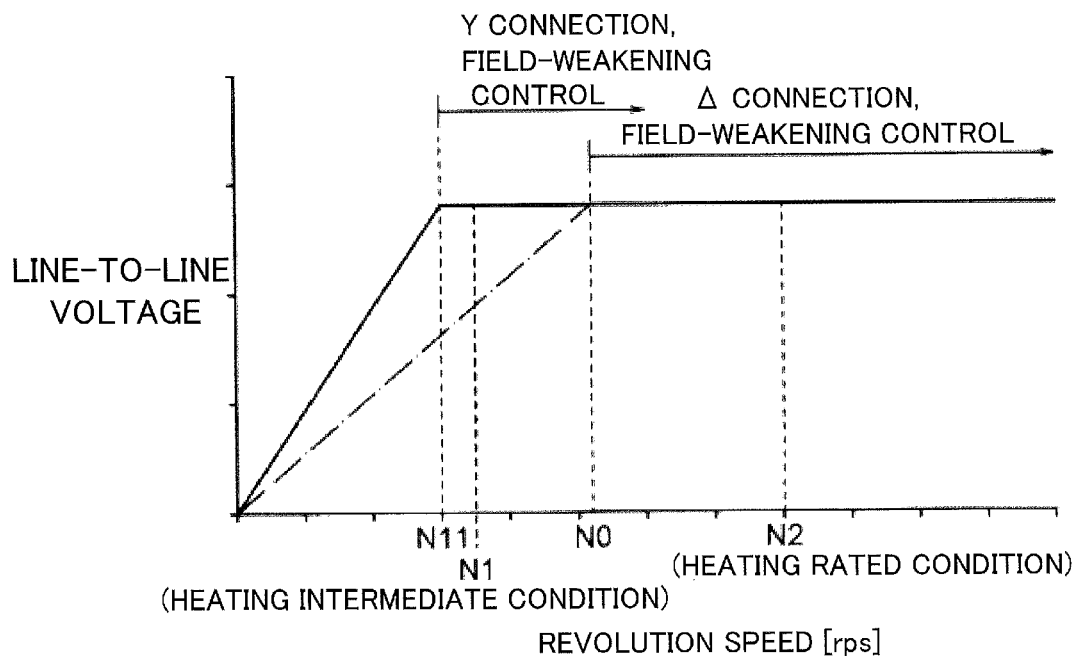
FIG. 16 is a graph showing a relationship between the line-to-line voltage and the revolution speed when switching from the Y connection to the delta connection is made.

FIG. 16 is a graph showing a relationship between the line-to-line voltage and the revolution speed when switching from the Y connection to the delta connection is made. In the example shown in FIG. 16, the aforementioned field-weakening control is started when the revolution speed reaches a revolution speed (referred to as a revolution speed N11) slightly lower than the revolution speed N1 (heating intermediate condition). When the revolution speed N increases further and reaches a revolution speed N0, the connection condition is switched from the Y connection to the delta connection. The revolution speed N11 is a revolution speed that is 5% lower than the revolution speed N1 (namely, N11=N1×0.95), for example.

Since the switching from the Y connection to the delta connection lowers the line-to-line voltage to $1/\sqrt{3}$ times that in the Y connection, the level of the field weakening can be reduced to a low level (namely, the weakening current can be reduced). By this control, the copper loss caused by the weakening current can be reduced and the decrease in the motor efficiency and the decrease in the motor torque can be inhibited.

(Description of Conventional Driving Device)

A neodymium rare earth magnet containing neodymium, iron and boron as principal ingredients decreases in coercivity and becomes likely to be demagnetized as its temperature rises. Therefore, in the driving device for driving the motor 1 including the rotor 20 provided with the rare earth magnets 25 as neodymium rare earth magnets, it is necessary to set an overcurrent protection level, as the upper limit of the motor driving current Io for preventing the motor driving current Io from causing irreversible demagnetization to the rare earth magnets 25, at a low level. The overcurrent protection level will be explained in detail below.

When a demagnetizing field is applied to the rare earth magnet 25 and the demagnetizing field exceeds certain magnitude, there occurs a phenomenon in which a magnetic property of the rare earth magnet 25 deteriorates and does not recover to the original magnetic property, namely, the irreversible demagnetization. A numerical value representing the degree of unlikeliness of the occurrence of the irreversible demagnetization is referred to as the coercivity. When the irreversible demagnetization occurs to the rare earth magnets 25 of the rotor 20, properties of the motor 1 deteriorate. Thus, it is important to lay out the load design so that the demagnetizing field due to armature reaction does not cause the irreversible demagnetization to the rare earth magnets 25 of the rotor 20 and to select rare earth magnets 25 having appropriate coercivity to prevent the irreversible demagnetization.

It is known that the coercivity of the neodymium rare earth magnet containing neodymium, iron and boron as principal ingredients drops, as its temperature rises. In cases of using a motor 1 employing the neodymium rare earth magnets as the permanent magnets of the rotor 20 in a high-temperature atmosphere higher than or equal to 100° C. like a compressor, the coercivity of the magnets drops at a temperature coefficient in a range of approximately −0.5 [%/AK] to −0.6 [%/AK] with the increase in the temperature. Thus, it is desirable to increase the coercivity by adding dysprosium (Dy) or terbium (Tb) to the neodymium rare earth magnet containing neodymium, iron and boron as principal ingredients.

In a common type of compressor, the upper limit of the atmosphere temperature of the motor 1 is approximately 140° C. In such a common type of compressor, the motor 1 is used in a temperature range from the normal temperature 20° C. to an upper limit temperature that is approximately 120° C. higher than the normal temperature 20° C. (i.e., approximately 140° C.). Therefore, at the temperature coefficient of −0.5 [%/AK] (i.e., temperature coefficient at which the coercivity drops by 0.5% per a 1° C. temperature rise), for example, the coercivity of the rare earth magnet 25 drops by approximately 60%.

In order to prevent the demagnetization even at the maximum load of the compressor, coercivity of approximately 600 [kA/m] to 1000 [kA/m] is necessary, and in order to guarantee the coercivity (approximately 600 [kA/m] to 1000 [kA/m]) in the atmosphere temperature of 140° C., the normal temperature coercivity has to be designed at approximately 1500 [kA/m] to 2500 [kA/m].

Further, in regard to residual flux density Br as an index representing the magnitude of the magnetic force of the rare earth magnet 25 as the permanent magnet, in cases of neodymium rare earth magnets, magnets whose residual flux density Br at the normal temperature (20° C.) is 1.3 T or higher and whose temperature coefficient is approximately −0.12 [%/AK] are commonly used for the purpose of compressors. Similarly to the coercivity, the residual flux density also shows a temperature-dependent property, and a temperature rise for 100° C. means a 12% drop in the residual flux density.

The rare earth magnet 25 is demagnetized by lower electric current as its temperature rises. In order to prevent the rare earth magnet 25 from being demagnetized during the driving of the motor 1, the overcurrent protection level is set at a value lower than the electric current demagnetizing the rare earth magnet 25.

Conventionally, the overcurrent protection level is fixed at a constant level. Since the driving state of the motor 1 is unknown, the overcurrent protection level is determined at a maximum temperature where the rare earth magnet 25 is most likely to be demagnetized (140° C. in this example). Accordingly, in a region where the temperature of the rare earth magnet 25 is low, the output power is limited by the low overcurrent protection level even though no demagnetization is caused by increasing the electric current of the inverter 103. Therefore, the present application proposes a novel driving device that will be described below.

(Driving Device 100a According to Embodiment of Present Invention)

Figure 17:
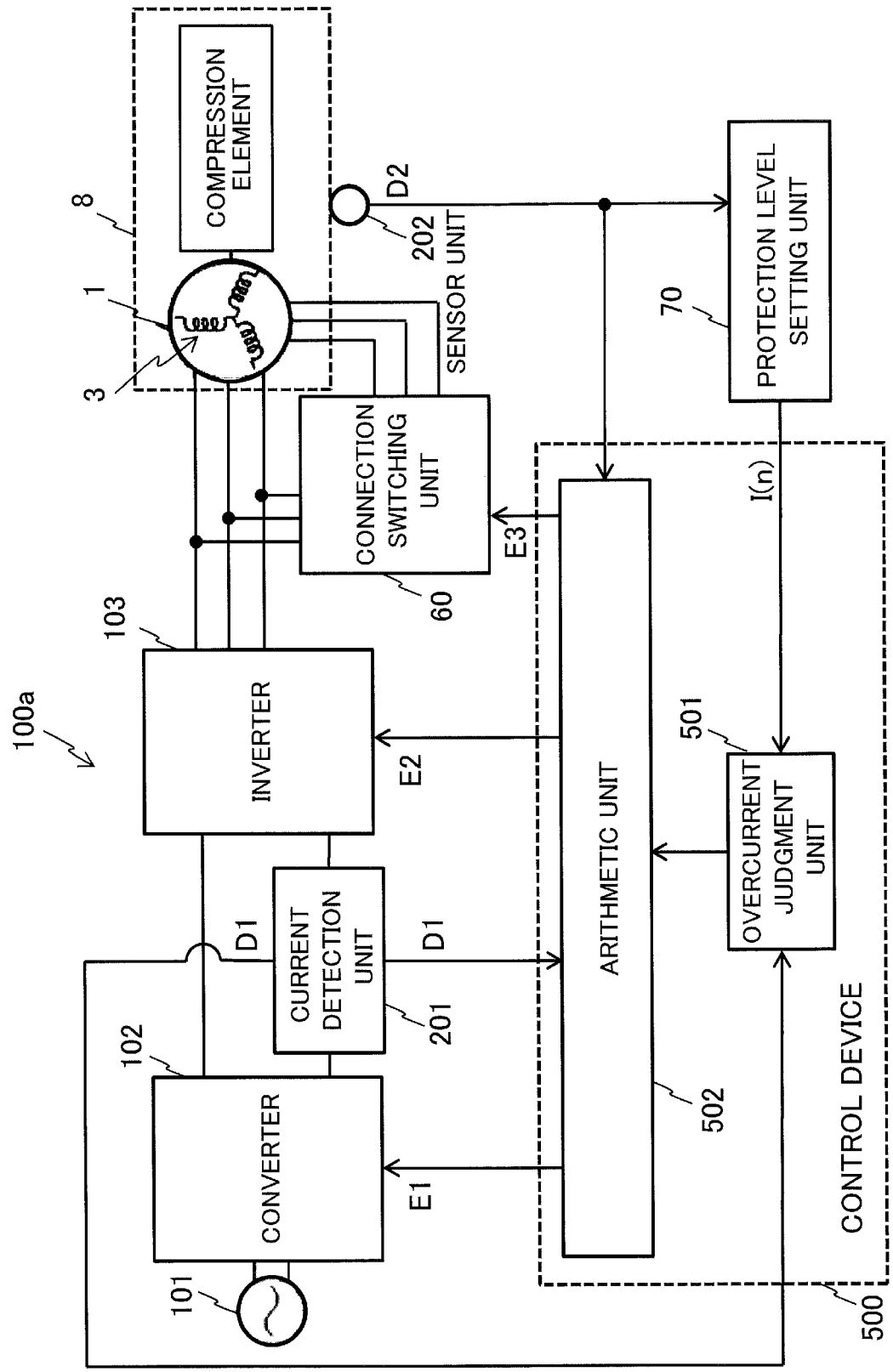
FIG. 17 is a diagram schematically showing a configuration of a driving device according to an embodiment of the present invention.

FIG. 17 is a diagram schematically showing a configuration of a driving device 100a according to the embodiment of the present invention. In FIG. 17, each component identical or corresponding to a component shown in FIG. 7 and FIG. 8 is assigned the same reference character as in FIG. 7 and FIG. 8. The driving device 100a differs from the driving device 100 shown in FIG. 7 and FIG. 8 in including a sensor unit 202 and a protection level setting unit 70 and in control performed by a control device 500.

As shown in FIG. 17, the driving device 100a includes the converter 102 that rectifies the output of the AC power supply 101, the inverter 103, the connection switching unit 60, the protection level setting unit 70, the control device 500, a current detection unit 201 as a first detector, and the sensor unit 202 as a second detector.

The driving device 100a drives the motor 1. The motor 1 causes a compression element of the compressor 8 (41) to operate. The motor 1 includes the rotor 20 (FIG. 1) provided with the rare earth magnets 25 (FIG. 1). The rare earth magnet 25 is a neodymium rare earth magnet, for example. The neodymium rare earth magnet is a permanent magnet containing neodymium, iron and boron as principal ingredients.

The inverter 103 supplies the motor driving current Io to the coil 3 of the stator 10 (FIG. 1) of the motor 1. The motor driving current is referred to also as "motor current". The control device 500 outputs a control signal E2 to the inverter 103 so as to perform variable speed driving on the motor 1 by means of the field-weakening control.

The current detection unit 201 outputs a detection signal (first detection signal) D1 corresponding to the motor driving current Io supplied to the motor 1 by the inverter 103. In FIG. 17, the current detection unit 201 detects an electric current flowing through a bus line connecting the converter 102 and the inverter 103. However, the electric current detected by the current detection unit 201 may also be detected at a different position such as a position between the inverter 103 and the motor 1 or a position between the inverter 103 and the connection switching unit 60.

The protection level setting unit 70 sets the overcurrent protection level. The control device 500 includes an overcurrent judgment unit 501 that judges whether or not the motor driving current Io obtained based on a condition detection signal D2 has exceeded the overcurrent protection level I(n) and an arithmetic unit 502 that controls the converter 102, the inverter 103 and the connection switching unit 60 by outputting control signals E1, E2 and E3 to the converter 102, the inverter 103 and the connection switching unit 60. Further, the arithmetic unit 502 of the control device 500 executes control of reducing the motor driving current Io supplied from the inverter 103 when the motor driving current Io based on the detection signal D1 is judged to have exceeded the overcurrent protection level I(n) (i.e., first control). The reduction in the motor driving current Io is, in general, interruption of the motor driving current Io. The reduction in the motor driving current Io can also be control of instantaneously reducing the motor driving current Io to a predetermined current level or lower.

The protection level setting unit 70 changes the overcurrent protection level I(n) based on the condition detection signal (second detection signal) D2 outputted by the sensor unit 202. When the protection level setting unit 70 lowers the overcurrent protection level I(n), the control device 500 executes control of reducing the motor driving current Io (i.e., second control). Here, "when the protection level setting unit 70 lowers the overcurrent protection level" includes the same time as the time point when the protection level setting unit 70 lowers the overcurrent protection level and a time immediately before the time point when the protection level setting unit 70 lowers the overcurrent protection level.

The connection switching unit 60 switches the connection condition of the motor 1 based on a control signal E3. The connection switching unit 60 switches the connection condition of the motor 1 between the Y connection and the delta connection. The control device 500 is capable of executing the second control by making the connection switching unit 60 switch the connection condition from the Y connection to the delta connection. Since the switching from the Y connection to the delta connection lowers the line-to-line voltage to 1/√3 times the line-to-line voltage in the Y connection, the level of the field weakening can be reduced to a low level (namely, the weakening current can be reduced).

Further, the control device 500 is capable of changing the bus voltage applied to the inverter 103 by controlling the converter 102. The control device 500 is capable of lowering the motor driving current Io supplied from the inverter 103 to the motor 1 by raising the bus voltage outputted from the converter 102. In a case where the converter 102 is controlled, the driving device 100a can also be configured to include no connection switching unit 60.

(Overcurrent Protection Level Changing Method 1 in Driving Device 100a)

Figure 18:
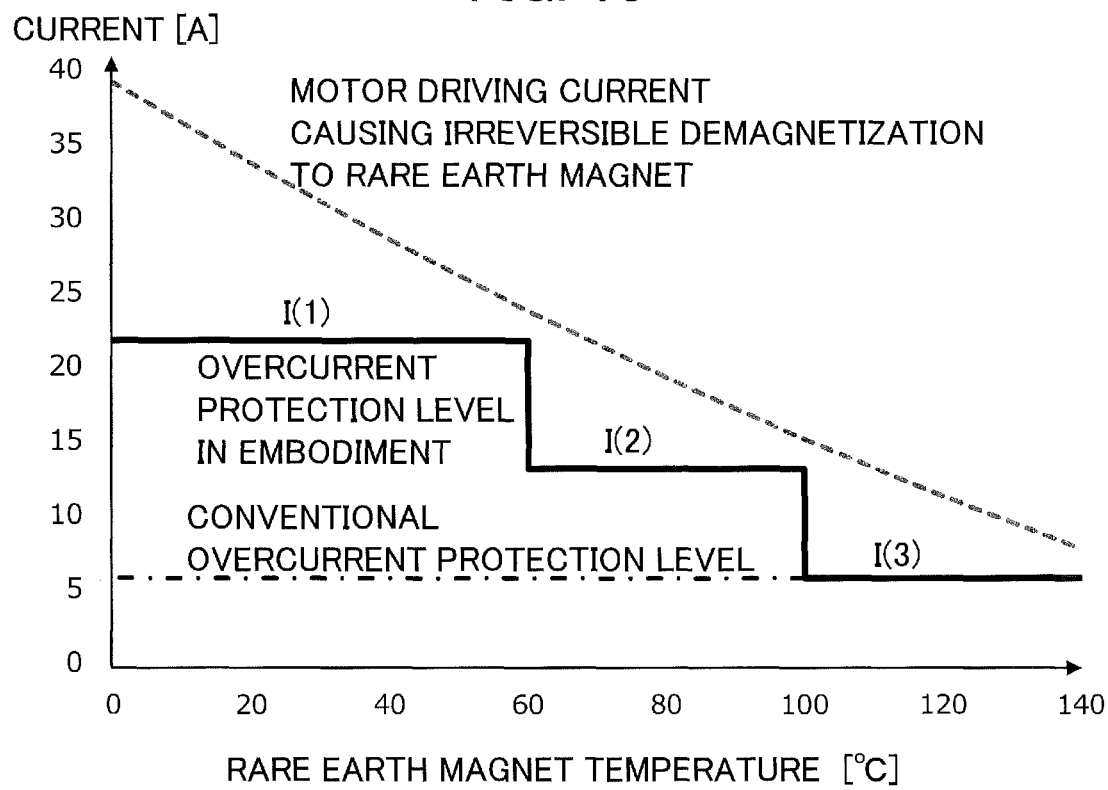
FIG. 18 is a graph showing a motor driving current that causes irreversible demagnetization to a rare earth magnet (broken line), a conventional overcurrent protection level (chain line), and an overcurrent protection level in the embodiment of the present invention (solid lines).

FIG. 18 is a graph showing the motor driving current that causes the irreversible demagnetization to the rare earth magnet 25 as the neodymium rare earth magnet (curved broken line), a conventional overcurrent protection level (straight chain line), and the overcurrent protection level in the embodiment (thick polygonal line). In FIG. 18, the horizontal axis represents the temperature [° C.] of the rare earth magnet 25, and the vertical axis represents the motor driving current [A] supplied to the coil 3 of the motor 1.

In FIG. 18, the curved line indicated by a broken line shows that the motor driving current causing the irreversible demagnetization to the rare earth magnet 25 lowers with the increase in the temperature of the rare earth magnet 25.

In FIG. 18, the straight line indicated by a chain line shows the overcurrent protection level in a conventional motor. The overcurrent protection level in the conventional motor is set at a value, e.g., 6 [A], that does not cause the irreversible demagnetization to the rare earth magnets 25 of the rotor of the motor in the vicinity of the highest temperature (e.g., 140° C.) in the operating temperature range of the motor (e.g., 0° C. to 140° C.).

In FIG. 18, the step-like polygonal line indicated by thick solid lines shows the overcurrent protection level I(n) in the driving device 100a according to the embodiment. In FIG. 18, n equals 1, 2 or 3. The overcurrent protection level in the driving device 100a according to the embodiment is set at a lower value, as the temperature (i.e., the temperature based on the condition detection signal D2 as the second detection signal) rises in the operating temperature range of the motor (e.g., 0° C. to 140° C.). In FIG. 18, when the temperature of the motor 1 (also being the temperature of the rare earth magnets 25) is in a range lower than 60° C., the overcurrent protection level is set at I(1)=22.0 [A], for example. When the temperature of the motor 1 is in a range higher than or equal to 60° C. and lower than 100° C., the overcurrent protection level is set at I(2)=13.3 [A], for example. When the temperature is in a range higher than or equal to 100° C. and lower than 140° C., the overcurrent protection level is set at I(3)=6.0 [A], for example.

As above, the protection level setting unit 70 changes the overcurrent protection level based on the temperature of the rare earth magnets 25 outputted from the sensor unit 202. For example, the protection level setting unit 70 has stored a plurality of current levels (i.e., overcurrent protection levels I(1) to I(N)) that satisfy I(n)>I(n+1), where n=1, 2, . . . , N and N is a predetermined positive integer. The protection level setting unit 70 sets a current level selected from the plurality of current levels as the overcurrent protection level and outputs the overcurrent protection level to the overcurrent judgment unit 501.

When driving a rare earth magnet motor, the driving device 100a according to the embodiment selects and sets a lower value as the overcurrent protection level as the temperature of the rare earth magnet 25 rises. In this case, a larger value is selected as n, as the temperature of the rare earth magnets 25 rises.

For example, the protection level setting unit 70 measures a demagnetization current property of the rare earth magnet 25 with respect to the temperature, which has previously been measured in a real machine, in regard to a plurality of temperature ranges, determines a current upper limit by setting the likelihood for the demagnetization current property measured in each temperature range, and previously stores the current upper limit in a database as the overcurrent protection level.

Besides the temperature of the rare earth magnets 25, it is also possible to partition the demagnetization current property with respect to a d-axis current component of the current flowing through the inverter 103 into a plurality of d-axis current ranges, determine a current upper limit by setting the likelihood for the demagnetization current in each d-axis current range, and previously store the current upper limit in a database as the overcurrent protection level.

The overcurrent judgment unit 501 judges whether or not the motor driving current Io at the current value corresponding to the detection signal D1 outputted from the current detection unit 201 provided between the converter 102 and the inverter 103 has exceeded the overcurrent protection level I(n) selected by the protection level setting unit 70. When the motor driving current Io at the current value corresponding to the detection signal D1 outputted from the current detection unit 201 has exceeded the overcurrent protection level I(n) set by the protection level setting unit 70, the arithmetic unit 502 stops the output of the motor driving current Io from the inverter 103 and thereby stops the motor 1.

The overcurrent judgment unit 501 can be formed with a plurality of comparators in multistage connection. In this case, the overcurrent judgment unit 501 is capable of comparing the motor driving current Io at the current value corresponding to the detection signal D1 outputted from the current detection unit 201 with a certain number of overcurrent protection levels corresponding to the number of the comparators in multistage connection. With such a configuration, the overcurrent judgment unit 501 is capable of instantaneously judging whether the motor driving current Io from the inverter 103 has exceeded the overcurrent protection level I(n) or not in a shorter time.

Further, the protection level setting unit 70 and the control device 500 may execute the processes by executing programs as software for a microcomputer, a DSP (Digital Signal Processor) or the like. Furthermore, the protection level setting unit 70 can be a part of the control device 500.

As above, in the driving device 100a according to the embodiment, the temperature of the rare earth magnets 25 is detected and the overcurrent protection level is selected depending on the temperature of the rare earth magnets 25, and thus the occurrence of the irreversible demagnetization of the rare earth magnets 25 due to the temperature rise of the rare earth magnets 25 can be prevented in a case where the rotor 20 of the motor 1 includes the rare earth magnets 25. Especially in a case where the motor 1 is used for a compressor whose temperature change is wide (e.g., the compressor 8 in FIG. 2), even when the temperature in the compressor is likely to rise excessively due to abnormal operation of the compressor, the operation of the inverter 103 can be stopped reliably and the occurrence of the irreversible demagnetization of the rare earth magnets 25 can be avoided.

Further, since the driving device 100a according to the embodiment selects the overcurrent protection level depending on the temperature of the rare earth magnets 25 as shown in FIG. 18, the range of the motor driving current Io capable of driving the motor 1 expands and motor driving with higher output torque can be realized compared to the conventional case (the case of the straight chain line in FIG. 18) where the overcurrent protection level is fixed at a constant level.

Furthermore, since the range of the motor driving current Io driving the motor 1 can be expanded, the output torque can be increased even in motors using rare earth magnets 25 having low coercivity. Accordingly, high output torque of the motor 1 equivalent to the output torque of conventional motors can be secured even if the amount of dysprosium or terbium added to the rare earth magnets 25 to increase the coercivity is reduced.

Moreover, by reducing dysprosium or terbium, the residual flux density of the rare earth magnets 25 increases and the motor driving current Io for driving the motor 1 can be reduced. In this case, the high-efficiency motor 1 with reduced copper loss can be formed.

In FIG. 18, the protection level setting unit 70 has stored three stages of data: the overcurrent protection level I(1) in the temperature range lower than 60° C., the overcurrent protection level I(2) in the temperature range higher than or equal to 60° C. and lower than 100° C., and the overcurrent protection level I(3) in the temperature range higher than or equal to 100° C., for example, as the candidates for the overcurrent protection level. Here, I(1)>I(2)>I(3) holds.

The protection level setting unit 70 sets (selects in this example) the overcurrent protection level based on the condition detection signal D2 outputted from the sensor unit 202 and outputs the overcurrent protection level to the overcurrent judgment unit 501.

Figure 19:
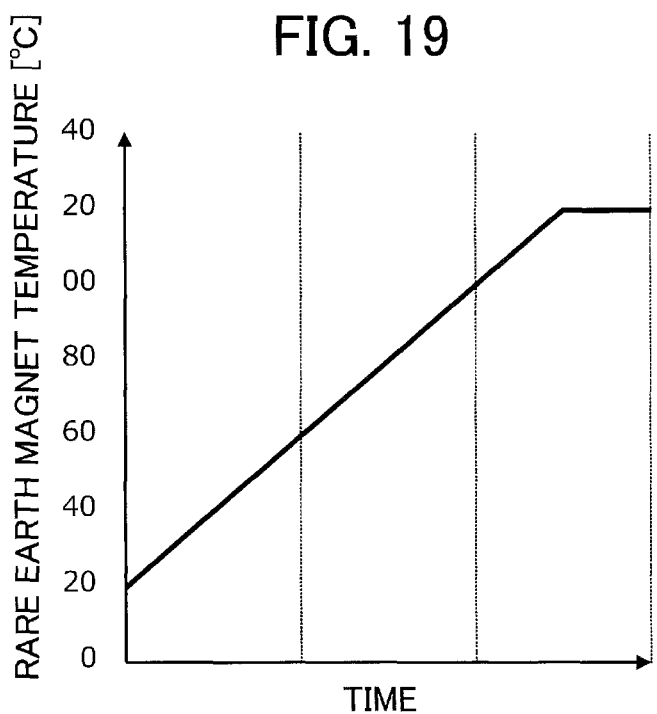
FIG. 19 is a graph showing a driving time of the motor and a temperature change of a rare earth magnet provided in a rotor.
Figure 20:
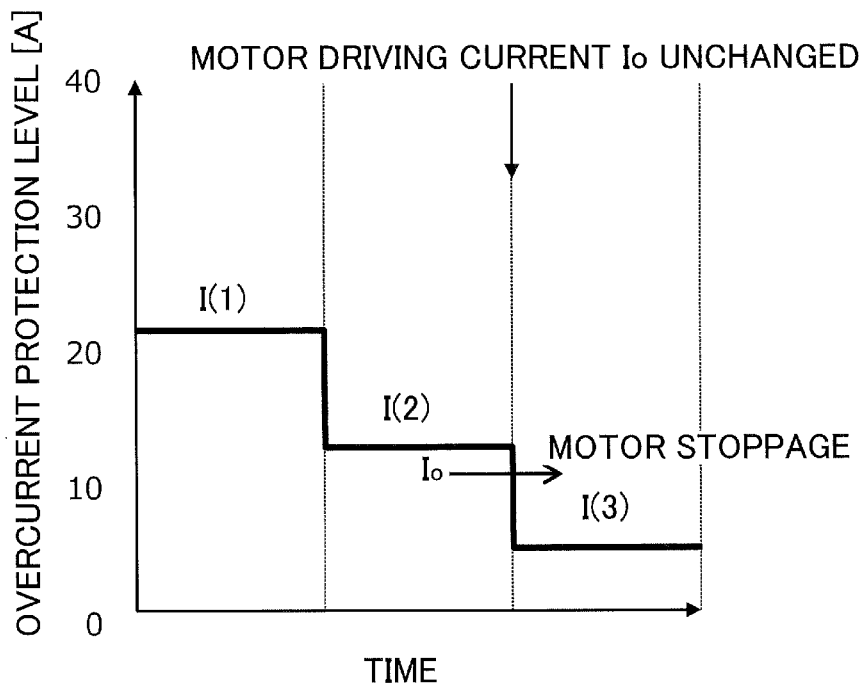
FIG. 20 is a diagram showing a problem that occurs when the overcurrent protection level set in the driving device of the motor is lowered.

FIG. 19 is a graph showing a driving time of the motor 1 and a temperature change of a rare earth magnet 25 provided in the rotor 20. In FIG. 19, the horizontal axis represents the driving time, that is, the time elapsed since the start of the driving, and the vertical axis represents the temperature [° C.] of the rare earth magnet 25. FIG. 20 is a diagram showing a problem that occurs when the overcurrent protection level set in the driving device of the motor 1 is lowered. In FIG. 20, the horizontal axis represents the driving time, that is, the time elapsed since the start of the driving, and the vertical axis represents the overcurrent protection level [A].

For example, when the temperature of the rare earth magnet 25 changes with the elapse of time as shown in FIG. 19, the protection level setting unit 70 changes the overcurrent protection level in the order of I(1), I(2) and I(3) based on the temperature change of the rare earth magnet 25 as shown in FIG. 20.

Here, when the overcurrent protection level is changed from I(2) to I(3), for example, there are cases where the motor driving current Io corresponding to the detection signal D1 outputted from the current detection unit 201 before the change satisfies I(2)>Io>I(3). However, if the overcurrent protection level is changed from I(2) to I(3) without changing the motor driving current Io as shown in FIG. 20, the motor driving current Io exceeds the overcurrent protection level I(3), and thus the switching operation of the inverter 103 stops and the motor 1 stops just at the time of changing the overcurrent protection level from I(2) to I(3).

In short, there are cases where the motor driving current Io becomes higher than the overcurrent protection level after the change due to the lowering of the overcurrent protection level by the driving device 100*a*. In this case, there is a problem in that the motor 1 stops or the output power of the motor 1 drops at the time of changing the overcurrent protection level.

(Field-Weakening Control)

Figure 21:
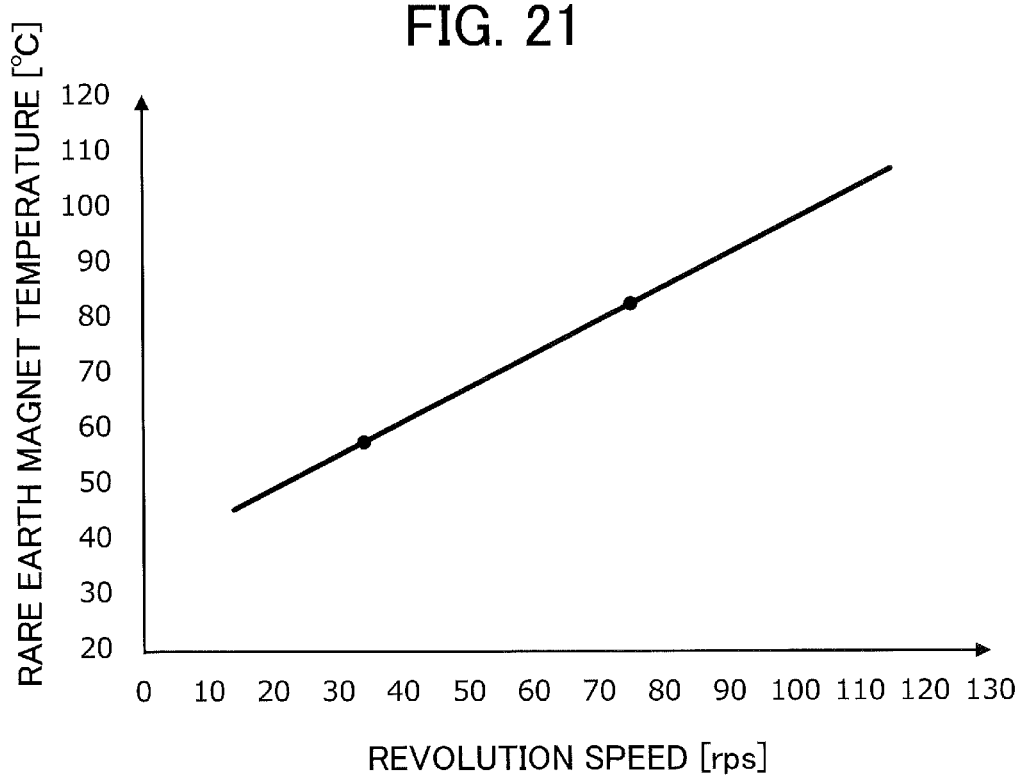
FIG. 21 is a graph showing an example of the revolution speed of the motor in the compressor and the temperature change of the rare earth magnet provided in the rotor.

FIG. 21 is a graph showing an example of the revolution speed of the motor 1 in the compressor and the temperature change of the rare earth magnet 25. In FIG. 21, the horizontal axis represents the revolution speed [rps] of the motor 1, and the vertical axis represents the temperature [° C.] of the rare earth magnet 25. FIG. 21 indicates that generally, as the revolution speed in the compressor increases, the motor 1 increases in the output torque, the atmosphere inside the compressor changes to a high-temperature and high-pressure state, and the temperature of the rare earth magnet 25 of the motor 1 rises.

Further, in the motor 1 performing the variable speed driving in a wide revolution speed range of 10 [rps] to 130 [rps] like a compressor, the motor 1 is driven by means of the field-weakening control in a high revolution speed region in order to increase the efficiency of the motor 1 in a low revolution speed region where the actual frequency of use is high. The field-weakening control will be explained briefly below.

In the motor 1 in which the rare earth magnets 25 are installed in the rotor 20, when the rotor 20 rotates, the magnetic flux of the rare earth magnet 25 links with the coil 3 of the stator 10 and inductive voltage occurs in the coil 3. The inductive voltage is proportional to the number of revolutions (i.e., the revolution speed) of the rotor 20 and is also proportional to the number of turns of the coil 3. Therefore, the inductive voltage increases, as the revolution speed of the motor 1 and the number of turns of the coil 3 increase.

The line-to-line voltage (referred to also as the "motor voltage") outputted from the inverter 103 equals the sum of the aforementioned inductive voltage and the voltage caused by the resistance and the inductance of the coil 3. The voltage caused by the resistance and the inductance of the coil 3 is negligibly low as compared with the inductive voltage. Therefore, the line-to-line voltage is practically governed by the inductive voltage.

The magnet torque of the motor 1 is proportional to the product of the inductive voltage transduced from the energy of the rare earth magnet 25 and the current flowing through the coil 3.

The inductive voltage increases, as the number of turns of the coil 3 increases. Thus, as the number of turns of the coil 3 increases, the current for generating necessary magnet torque is allowed to be lower. As a result, the loss caused by the energization of the inverter 103 can be reduced and the operating efficiency of the motor 1 can be increased. On the other hand, due to the increase in the inductive voltage, the line-to-line voltage governed by the inductive voltage reaches the inverter maximum output voltage at a lower revolution speed and the revolution speed cannot be increased over that revolution speed. The inverter maximum output voltage equals the bus voltage supplied from the converter 102 to the inverter 103.

In the field-weakening control, magnetic flux in a direction opposite to the direction of the magnetic flux of the rare earth magnet 25 is generated by the coil 3 and the magnetic flux of the rare earth magnet 25 is weakened, by which the inductive voltage is reduced and the driving to a higher revolution speed becomes possible.

However, since it is necessary to feed the weakening current as the current generating the magnetic flux in the direction of canceling the magnetic flux of the rare earth magnet 25, the motor driving current Io increases and the copper loss increases. Further, the increase in the motor driving current Io works as a factor facilitating the demagnetization of the rare earth magnet 25.

(Overcurrent Protection Level Changing Method 2 in Driving Device 100*a*)

The rare earth magnets 25 of the rotor 20 of the motor 1 become likely to be demagnetized as its temperature rises. Therefore, the driving device 100*a* needs to set the overcurrent protection level at a lower value as the temperature of the motor 1 rises. Further, while the motor 1 is required to output higher output torque as the revolution speed increases, the overcurrent protection level has to be set at a low value when the temperature of the motor 1 is high.

When the revolution speed of the motor 1 is continuously raised by the driving device 100a, the weakening current increases. Thus, when the driving device 100a selects the overcurrent protection level from a plurality of previously prepared current levels, the overcurrent protection level has to be lowered stepwise (or repeatedly bit by bit) since the temperature of the rare earth magnets 25 rises gradually with the continuous rise in the revolution speed of the motor 1.

In the driving device 100a according to the embodiment, the protection level setting unit 70 changes the overcurrent protection level based on the condition detection signal D2 outputted from the sensor unit 202, and concurrently the control device 500 changes the motor driving current Io.

Specifically, when the protection level setting unit 70 lowers the overcurrent protection level, the control device 500 executes control of reducing the motor driving current Io so as to prevent the motor 1 from stopping at the time of changing the overcurrent protection level (second control).

For example, when changing the motor driving current based on the condition detection signal D2 outputted from the sensor unit 202, the driving device 100a according to the embodiment uses the connection switching unit 60 for switching the connection condition of the motor 1 in order to lower the motor driving current Io as shown in FIG. 17. Specifically, the connection condition of the motor 1 is switched from the Y connection to the delta connection, for example.

Namely, the driving device 100a according to the embodiment lowers the overcurrent protection level based on the condition detection signal D2 outputted from the sensor unit 202 and switches the connection condition of the motor 1 from the Y connection to the delta connection. Alternatively, the driving device 100a switches the connection condition of the motor 1 from the Y connection to the delta connection immediately before lowering the overcurrent protection level based on the condition detection signal D2 outputted from the sensor unit 202.

For example, the driving device 100a switches the connection condition of the motor 1 from the Y connection to the delta connection by controlling the connection switching unit 60 and thereby lowers the line-to-line voltage to $1/\sqrt{3}$ times that in the Y connection. By the switching of the connection condition, the level of the field weakening can be reduced to a low level (namely, the weakening current can be reduced), and consequently, the motor driving current Io can be lowered. Accordingly, at the time of changing the overcurrent protection level, the motor driving current Io does not exceed the overcurrent protection level and the driving of the motor 1 can be continued.

By these methods, it is possible to avoid the occurrence of the situation where the motor 1 stops at the time of changing the overcurrent protection level. Further, when the temperature of the rare earth magnets 25 of the motor 1 is low, the output torque of the motor 1 can be increased by raising the overcurrent protection level and feeding a high motor driving current Io to the motor 1.

While an example of switching the connection condition from the Y connection to the delta connection has been described here, it is also possible to switch the connection condition from series connection to parallel connection as long as the switching lowers the current value. The same advantage can be obtained by switching the connection condition of the coil 3 from a first connection condition to a second connection condition in which the line-to-line voltage is lower than that in the first connection condition.

For example, in FIG. 18, as a set value for changing the overcurrent protection level depending on the temperature based on the condition detection signal D2 outputted from the sensor unit 202, the overcurrent protection level is set at I(1)=22.0 [A] (level that does not cause the irreversible demagnetization to the rare earth magnets 25 at 60° C.) in the temperature range lower than 60° C., the overcurrent protection level is set at I(2)=13.3 [A] (level that does not cause the irreversible demagnetization to the rare earth magnets 25 at 100° C.) in the temperature range higher than or equal to 60° C. and lower than 100° C., and the overcurrent protection level is set at I(3)=6.0 [A] (level that does not cause the irreversible demagnetization to the rare earth magnets 25 at 140° C.) in the temperature range higher than or equal to 100° C. and lower than 140° C. This is because the coercivity of the rare earth magnets 25 changes depending on the temperature.

In this example, the coercivity of the rare earth magnets 25 at the temperature of 60° C. is 1250 [kA/m], the coercivity of the rare earth magnets 25 at the temperature of 100° C. is 900 [kA/m], and the coercivity of the rare earth magnets 25 at the temperature of 140° C. is 600 [kA/m]. As above, with the increase in the temperature, the coercivity of the rare earth magnets 25 drops significantly.

While the overcurrent protection level at temperatures lower than 100° C. was conventionally 6 [A] (straight chain line shown in FIG. 18), the overcurrent protection level at temperatures lower than 100° C. is 13.3 [A] in the driving device 100a according to the embodiment. As above, with the driving device 100a according to the embodiment, a higher current can be fed to the motor 1 and the output torque of the motor 1 can be increased in comparison with conventional driving devices.

For example, let us consider a case where the temperature acquired by conversion from the condition detection signal D2 outputted from the sensor unit 202 is rising, the temperature is 98° C., the overcurrent protection level is I(2)=13.3 [A], the motor driving current Io is 8 [A] in the Y connection, and the motor 1 is driven at revolution speed of 80 [rps].

In this case, the temperature exceeds 100° C. if the temperature rise continues. Therefore, the driving device 100a determines to change the overcurrent protection level to I(3)=6.0 [A] as the level for the temperature range higher than or equal to 100° C. and lower than 140° C. However, if the driving device 100a changes the overcurrent protection level from I(2)=13.3 [A] to I(3)=6.0 [A], the motor driving current Io exceeds the overcurrent protection level I(3) as shown in FIG. 20 at the moment of switching the overcurrent protection level, and the control device 500 interrupts the motor driving current Io by controlling the inverter 103 and thereby stops the motor 1.

Figure 22:
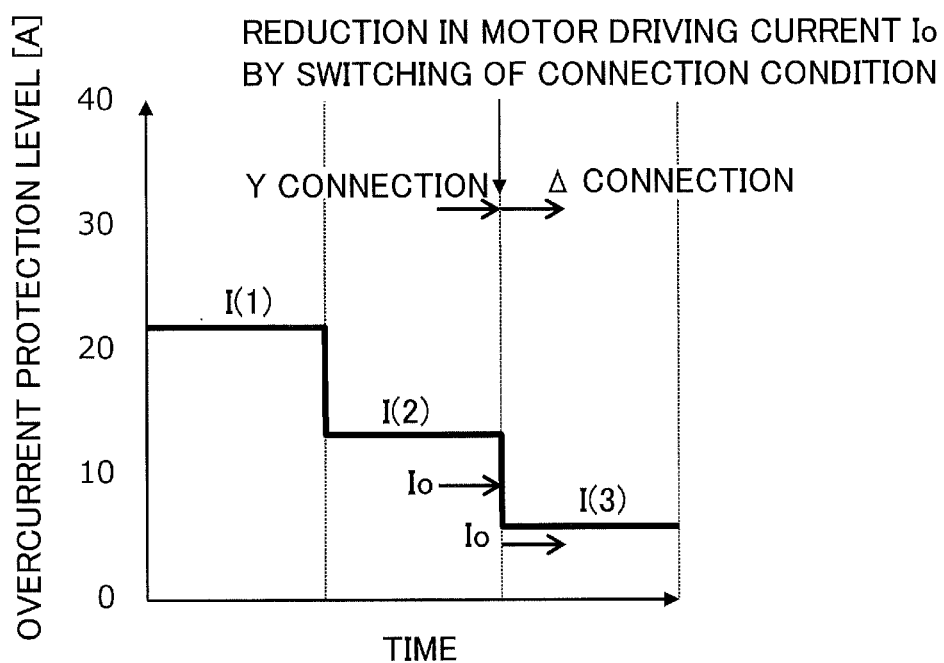
FIG. 22 is a diagram showing control executed by the driving device according to the embodiment of the present invention, namely, control of lowering the motor driving current by switching the connection condition when the overcurrent protection level set in the driving device of the motor is lowered.

Therefore, in the driving device 100a according to the embodiment, the connection condition of the motor 1 is switched from the Y connection to the delta connection before (preferably, immediately before) changing the overcurrent protection level. FIG. 22 is a graph showing an example of the driving time of the motor 1 and the changing of the overcurrent protection level. In FIG. 22, the horizontal axis represents the driving time, that is, the time elapsed since the start of the driving, and the vertical axis represents the overcurrent protection level [A]. If the connection condition of the motor 1 is switched from the Y connection to the delta connection before changing the overcurrent protection level, the line-to-line voltage of the motor 1 decreases and the weakening current decreases. Thus, the motor driving current Io decreases to a value (e.g., Io=4.5 [A]) lower than the overcurrent protection level I(3)=6.0 [A] after the change. Even if the overcurrent protection level is thereafter switched to I(3)=6.0 [A], the overcurrent protection level I(3) after the switching is higher than the motor driving current Io. Accordingly, it becomes possible to continue the driving of the motor 1 without stopping the motor 1.

Conversely, when the temperature acquired by the conversion from the condition detection signal D2 outputted from the sensor unit 202 is dropping, it is desirable to switch the connection condition from the delta connection to the Y connection after increasing the motor driving current Io within the overcurrent protection level.

(Example of Changing Bus Voltage when Changing Overcurrent Protection Level)

Figure 23:
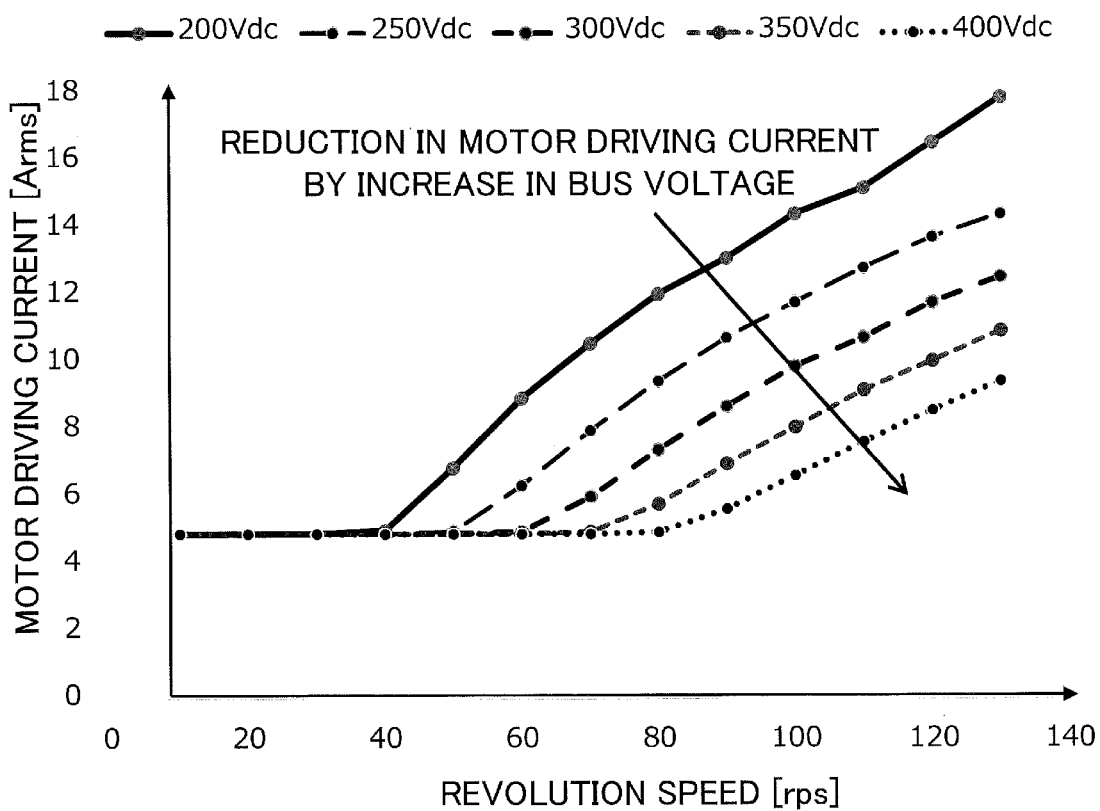
FIG. 23 is a diagram indicating that the motor driving current is lowered by raising bus voltage outputted from a converter.
Figure 24:
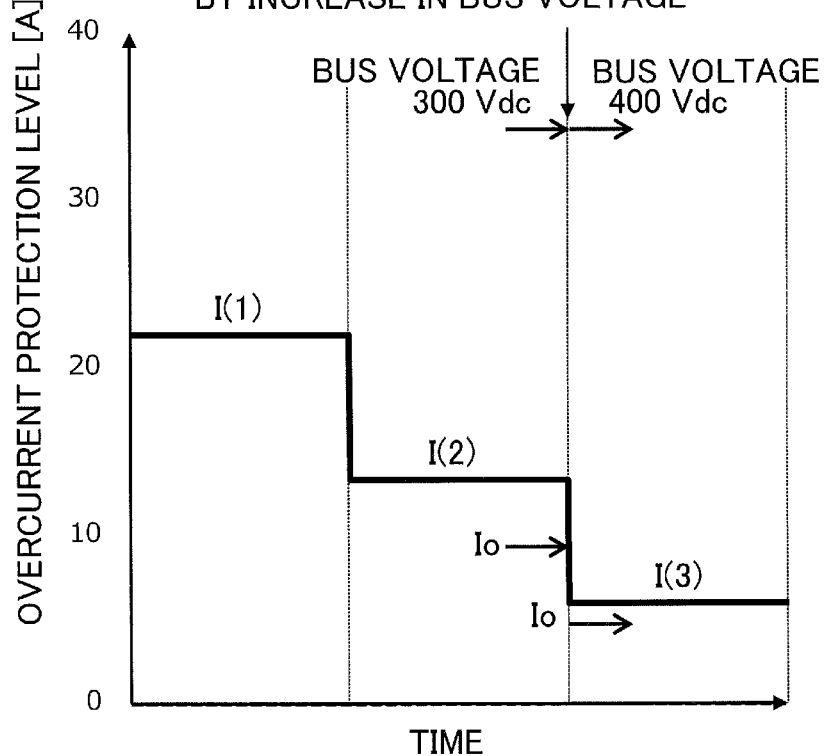
FIG. 24 is a diagram showing control executed by the driving device according to the embodiment of the present invention, namely, control of lowering the motor driving current by raising the bus voltage outputted from the converter when the overcurrent protection level set in the driving device of the motor is lowered.

FIG. 23 is a diagram indicating that the motor driving current (effective value) [Arms] is lowered by raising the bus voltage outputted from the converter 102. FIG. 24 is a diagram showing other control performed by the driving device 100a according to the embodiment, namely, control of lowering the motor driving current Io by raising the bus voltage outputted from the converter 102 when the overcurrent protection level set in the driving device 100a of the motor is lowered.

The driving device 100a according to the embodiment may execute control of lowering the overcurrent protection level based on the condition detection signal D2 outputted from the sensor unit 202 and reducing the motor driving current Io outputted from the inverter 103 by raising the bus voltage by controlling the converter 102 (second control).

In general, the converter 102 includes a capacitor and a rectification circuit including a reactor and a switching element (semiconductor element) and steps up or down the power supply voltage by means of the chopper operation. The control device 500 of the driving device 100a controls the converter 102 based on the condition detection signal D2 as the second detection signal outputted from the sensor unit 202. The switching element is a Si-MOSFET (Metal-Oxide-Semiconductor Field-Effect Transistor), for example. The switching element can also be a SiC-MOSFET that is a wide band gap semiconductor. In this case, the switching loss can be reduced and a high-efficiency driving device 100a with low converter loss at the time of stepping up or down the voltage can be formed. Further, GaN excels in the switching property at high frequencies. Therefore, the switching element can also be a GaN-MOSFET that is a wide band gap semiconductor. Furthermore, the switching element can also be a different wide band gap semiconductor formed with gallium nitride (GaN), diamond and so forth. Especially, the SiC-MOSFET is excellent in that it has higher heatproof temperature, higher dielectric breakdown strength and higher thermal conductivity in comparison with Si-MOSFET.

The driving device 100a can also be a device that raises the bus voltage by controlling the converter 102 and thereby reduces the motor driving current Io. In this case, it is possible to decrease the field-weakening current when the motor 1 is driven by means of the field-weakening control in the high revolution speed range.

The driving device 100a according to the embodiment changes a maximum bus voltage Vd(n) inputted to the inverter 103 so that a motor driving current Io lower than the overcurrent protection level I(n) selected based on the condition detection signal D2 outputted from the sensor unit 202 is supplied from the inverter 103 to the motor 1. The driving device 100a controls the converter 102 so that the maximum bus voltage Vd(n) when I(n) has been set as the overcurrent protection level and the maximum bus voltage Vd(n+1) when I(n+1) (<I(n)) has been set as the overcurrent protection level satisfy Vd(n) Vd(n+1). As above, even when the overcurrent protection level becomes low, the driving device 100a is capable of continuing the driving of the motor 1 without reducing the output torque of the motor 1 while avoiding the stoppage of the motor 1 by decreasing the field-weakening current.

While the overcurrent protection level when the temperature of the rare earth magnets 25 is lower than 100° C. was conventionally 6 [A] (straight chain line shown in FIG. 18), the overcurrent protection level at temperatures lower than 100° C. is 13.3 [A] in the driving device 100a according to the embodiment. As above, with the driving device 100a according to the embodiment, a higher current can be fed to the motor 1 and the output torque of the motor 1 can be increased in comparison with conventional driving devices.

For example, let us consider a case where the temperature acquired by the conversion from the condition detection signal D2 outputted from the sensor unit 202 is rising, the temperature is 98° C., the overcurrent protection level is I(2)=13.3 [A], the motor driving current Io is 8 [A] in the Y connection, and the motor 1 is driven at revolution speed of 80 [rps].

In this case, the temperature exceeds 100° C. if the temperature rise continues. Therefore, the driving device 100a determines to change the overcurrent protection level to I(3)=6.0 [A] as the current level for the temperature range higher than or equal to 100° C. and lower than 140° C. However, if the driving device 100a changes the overcurrent protection level from I(2)=13.3 [A] to I(3)=6.0 [A], the motor driving current Io exceeds the overcurrent protection level I(3) as shown in FIG. 20 at the moment of switching the overcurrent protection level, and the control device 500 interrupts the motor driving current Io by controlling the inverter 103 and thereby stops the motor 1.

Therefore, in the driving device 100a according to the embodiment, the bus voltage outputted from the converter 102 is switched from 300 [Vdc] to 400[Vdc] before (preferably, immediately before) lowering the overcurrent protection level. Then, the weakening current decreases, and thus the motor driving current can be decreased to a level (e.g., Io=4.5 [A]) lower than the overcurrent protection level after the change. Thus, when the overcurrent protection level is switched to I(3)=6.0 [A], the motor driving current Io does not exceed I(3)=6.0 [A]. Accordingly, it becomes possible to continue the driving of the motor 1 without stopping the motor 1.

Conversely, when the temperature acquired by the conversion from the condition detection signal D2 outputted from the sensor unit 202 is dropping, the driving device 100a may lower the bus voltage after increasing the motor driving current Io within the overcurrent protection level.

(Concrete Example of Sensor Unit)

In FIG. 17, the sensor unit 202 for detecting the driving state of the motor 1 is, for example, a thermistor as a temperature sensor for detecting the temperature of the motor 1. The temperature sensor may also be a temperature sensor that detects the temperature of an outer surface of a hermetic container forming an outer shell of the hermetic type compressor. Further, the temperature sensor may also be a temperature sensor that detects the temperature (discharge temperature) of the refrigerant flowing in a refrigerant channel connected to the compressor. In short, the sensor unit 202 may be arranged at any position as long as a physical quantity corresponding to the temperature of the rare earth magnets 25 of the rotor 20 of the motor 1 can be detected.

In a case where the temperature sensor is arranged outside the compressor, the temperature sensor can be attached easily without the need of modifying a refrigeration circuit itself including the compressor. It is also possible to substitute the temperature sensor with an existing type of temperature sensor that detects discharge temperature of the heat exchanger of the outdoor unit of the air conditioner. In this case, cost reduction by reducing the number of components becomes possible.

The sensor unit 202 can also be a means that calculates the temperature of the rare earth magnets 25 of the rotor 20 of the motor 1 from the detection signal D1 outputted from the current detection unit 201. Namely, the control device 500 can calculate the temperature of the rare earth magnets 25 from the current value detected by the current detection unit 201.

(Modification)

Figure 25:
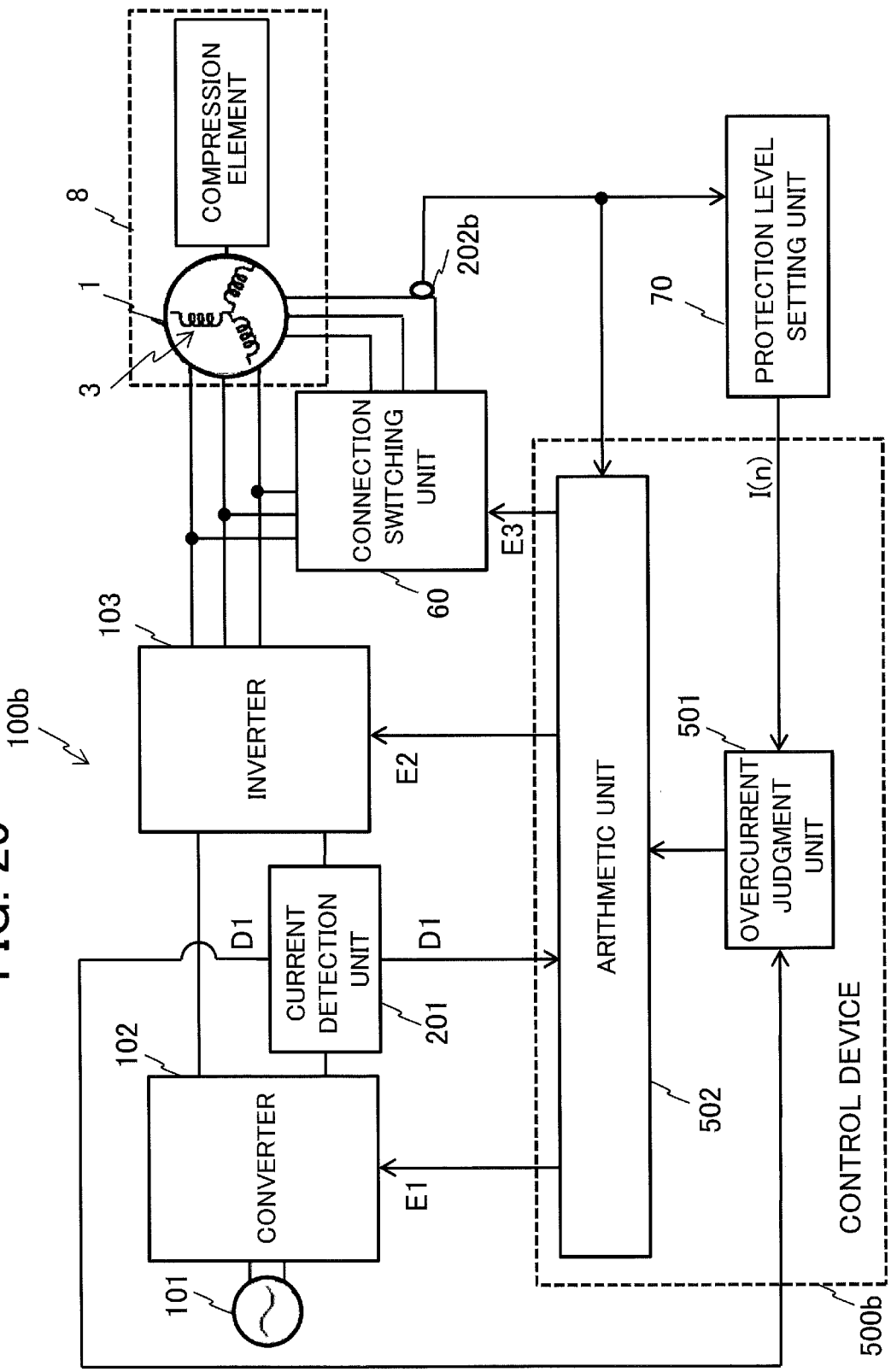
FIG. 25 is a diagram schematically showing a configuration of a driving device according to a modification of the embodiment of the present invention.

FIG. 25 is a diagram schematically showing a configuration of a driving device 100b according to a modification of the embodiment of the present invention. In FIG. 25, each component identical or corresponding to a component shown in FIG. 17 is assigned the same reference character as in FIG. 17.

In FIG. 25, a control device 500b calculates an inductive voltage constant e1 from a current value detected by a current detection unit 202b. Further, the control device 500b calculates a temperature T1 of the rare earth magnets 25 based on the calculated inductive voltage constant e1. The temperature T1 of the rare earth magnets 25 can be calculated from an inductive voltage constant e0 at a predetermined reference temperature T0, the inductive voltage constant e1 obtained from the detected current value, and a temperature coefficient k of the residual flux density of the rare earth magnets 25 by using the following expression:

$$T1=T0+(((e1/e0)-1)\times 100)/k.$$

Based on the calculated temperature of the rare earth magnets 25, the driving device 100b is capable of executing the selection of the overcurrent protection level and the changing of the motor driving current at the time of switching the overcurrent protection level.

As above, with the configuration for calculating the temperature of the rare earth magnets 25 by the calculation of the inductive voltage constant, it becomes unnecessary to provide a temperature sensor on the outer shell of the compressor 8, and thus the cost necessary for installing the temperature sensor can be cut.

Effect of Embodiment

With the driving devices 100a and 100b according to the embodiment, the performance of the motor 1 can be fully demonstrated throughout the operating temperature range of the motor 1. Further, high reliability of the operation of the motor 1 can be secured since the stoppage of the motor 1 at the time of changing the overcurrent protection level can be avoided.

With the compressor 8 (41) according to the embodiment, the performance of the compressor 8 (41) can be fully demonstrated throughout the operating temperature range of the motor 1 driving the compression element. Further, high reliability of the operation of the compressor 8 (41) can be secured since the stoppage of the motor 1 can be avoided when the driving device 100a, 100b changes the overcurrent protection level.

With the air conditioner 5 according to the embodiment, the air-conditioning capacity can be fully demonstrated throughout the operating temperature range of the compressor 8 (41) of the air conditioner 5. Further, high reliability of the air-conditioning operation can be secured since the stoppage of the motor 1 can be avoided when the driving device 100a, 100b changes the overcurrent protection level.

What is claimed is:

1. A driving device for driving a motor including a rotor having a neodymium rare earth permanent magnet, principal ingredients of which are neodymium, iron and boron, the driving device comprising:
    an inverter to perform field weakening control for the motor, thereby driving the motor at a variable speed;
    a first detector to output a first detection signal corresponding to a motor drive current supplied to the motor by the inverter;
    a second detector to output a second detection signal corresponding to a driving state of the motor; and
    circuitry to set an overcurrent protection level and to control the inverter, wherein
    immediately after the motor drive current corresponding to the first detection signal exceeds the overcurrent protection level, the circuitry executes first control to reduce the motor drive current, and
    when the circuitry reduces the overcurrent protection level to a new current level, based on the second detection signal, the circuitry executes second control to reduce the motor drive current to a level lower than the new current level, wherein immediately after the motor drive current corresponding to the first detection signal exceeds the overcurrent protection level, the circuitry executes first control to reduce the motor drive current, and when the circuitry reduces the overcurrent protection level to a new current level, based on the second detection signal, the circuitry executes second control to reduce the motor drive current to a level lower than the new current level, wherein
    the circuitry previously stores a plurality of current levels and selects one current level among the plurality of current levels as the overcurrent protection level, and
    the circuitry controls a converter so that a maximum value Vd(n) of the bus voltage when setting the overcurrent protection level at l(n) and a maximum value Vd(n+1) of the bus voltage when setting the overcurrent protection level at l(n+1) satisfy Vd(n) Vd(n+1), where
    N represents a predetermined integer,
    n represents an integer larger than or equal to 1 and smaller than or equal to N,
    l(n) represents each of the plurality of current levels, and
    l(n)>l(n+1).

2. The driving device according to claim 1, further comprising:
    one or more switches to switch connection condition of the motor,
    wherein the circuitry executes the second control by making the one or more switches switch the connection condition.

3. The driving device according to claim 2, wherein the one or more switches switch the connection condition between Y connection and delta connection.

4. The driving device according to claim 3, wherein the circuitry executes the second control by making the one or more switches switch the connection condition from the Y connection to the delta connection.

5. The driving device according to claim 1,
wherein the converter generates a bus voltage outputted to the inverter, and
wherein the circuitry makes the converter change the bus voltage.

6. The driving device according to claim 5, wherein the circuitry executes the second control by making the converter raise the bus voltage.

7. The driving device according to claim 1, wherein
the second detector is a temperature sensor that detects a temperature of the motor or a temperature of a member or space whose temperature changes corresponding to the temperature of the motor, and
the second detection signal is a temperature detection signal outputted from the temperature sensor.

8. The driving device according to claim 7, wherein the circuitry sets a lower current level as the overcurrent protection level as the temperature indicated by the temperature detection signal rises.

9. The driving device according to claim 1, wherein
the second detector outputs a signal representing a value corresponding to an inductive voltage caused by the neodymium rare earth magnet to a coil of a stator of the motor as the second detection signal, and
the circuitry sets the overcurrent protection level based on the second detection signal.

10. The driving device according to claim 1, wherein
the second detector is a current detector that detects an inductive current flowing through a coil of a stator of the motor due to the neodymium rare earth magnet, and
the circuitry sets the overcurrent protection level based on the inductive current.

11. The driving device according to claim 1, wherein the circuitry changes the overcurrent protection level based on the second detection signal when a temperature detected based on the second detection signal is in a predetermined temperature range higher than or equal to 100° C.

12. The driving device according to claim 5, wherein
the converter has a rectification circuit including a switching element, and
the switching element is a SiC-MOSFET or a GaN-MOSFET.

13. The driving device according to claim 1, wherein the circuitry executes the second control concurrently with or immediately before a time point when the circuitry lowers the overcurrent protection level to the new current level, based on the second detection signal.

14. A compressor comprising the driving device according to claim 1.

15. An air conditioner comprising the compressor according to claim 14.

* * * * *